(12) United States Patent
Chong et al.

(10) Patent No.: US 10,527,900 B2
(45) Date of Patent: Jan. 7, 2020

(54) DISPLAY SUBSTRATE

(71) Applicant: Samsung Display Co., Ltd., Yongin-si, Gyeonggi-do (KR)

(72) Inventors: Joonggun Chong, Yongin-si (KR); Yonghwan Shin, Asan-si (KR); Kwangho Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/883,778

(22) Filed: Jan. 30, 2018

(65) Prior Publication Data

US 2018/0284552 A1  Oct. 4, 2018

(30) Foreign Application Priority Data

Mar. 28, 2017 (KR) .................. 10-2017-0039324

(51) Int. Cl.
| | | |
|---|---|---|
| *G02F 1/1362* | (2006.01) | |
| *H01L 27/12* | (2006.01) | |
| *G02F 1/1333* | (2006.01) | |

(52) U.S. Cl.
CPC .. *G02F 1/136286* (2013.01); *G02F 1/136209* (2013.01); *G02F 1/136277* (2013.01); *H01L 27/124* (2013.01); *G02F 2001/133302* (2013.01); *G02F 2001/136222* (2013.01)

(58) Field of Classification Search
None
See application file for complete search history.

(56) References Cited

U.S. PATENT DOCUMENTS

2001/0019392 A1* 9/2001 Sakamoto ............. G02F 1/1393
349/139

FOREIGN PATENT DOCUMENTS

KR  10-0795344  10/2007

* cited by examiner

*Primary Examiner* — Anthony Ho
*Assistant Examiner* — Kevin Quinto
(74) *Attorney, Agent, or Firm* — Innovation Counsel LLP

(57) ABSTRACT

A display substrate includes a base substrate, a gate electrode, a semiconductor layer, a source electrode, a drain electrode, a first black organic layer, a data line and a pixel electrode. The gate electrode is disposed on the base substrate. The semiconductor layer is disposed on the gate electrode. The source electrode is disposed on the semiconductor layer. The drain electrode is disposed on the semiconductor layer and is spaced apart from the source electrode. The first black organic layer is disposed on the source electrode and the drain electrode. The data line is disposed on the first black organic layer, and is electrically connected to the source electrode through a contact hole formed through the first black organic layer. The pixel electrode is electrically connected to the drain electrode. Thus, display quality of a display apparatus including the display substrate may be improved.

19 Claims, 24 Drawing Sheets

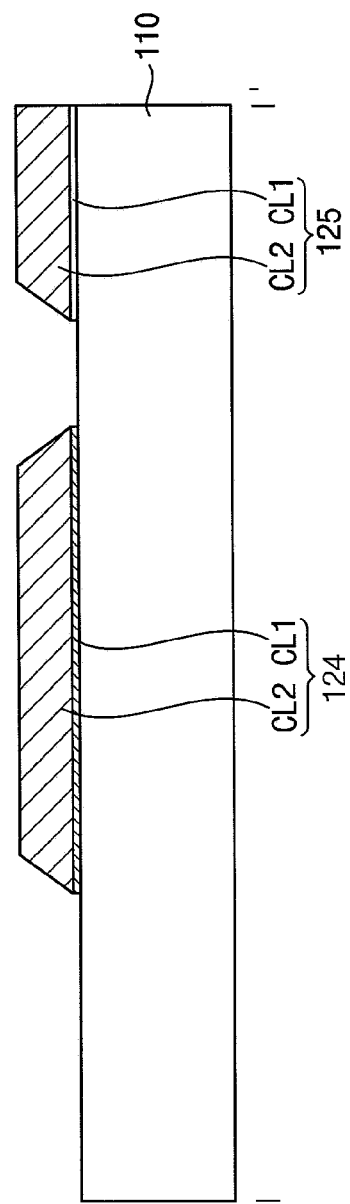

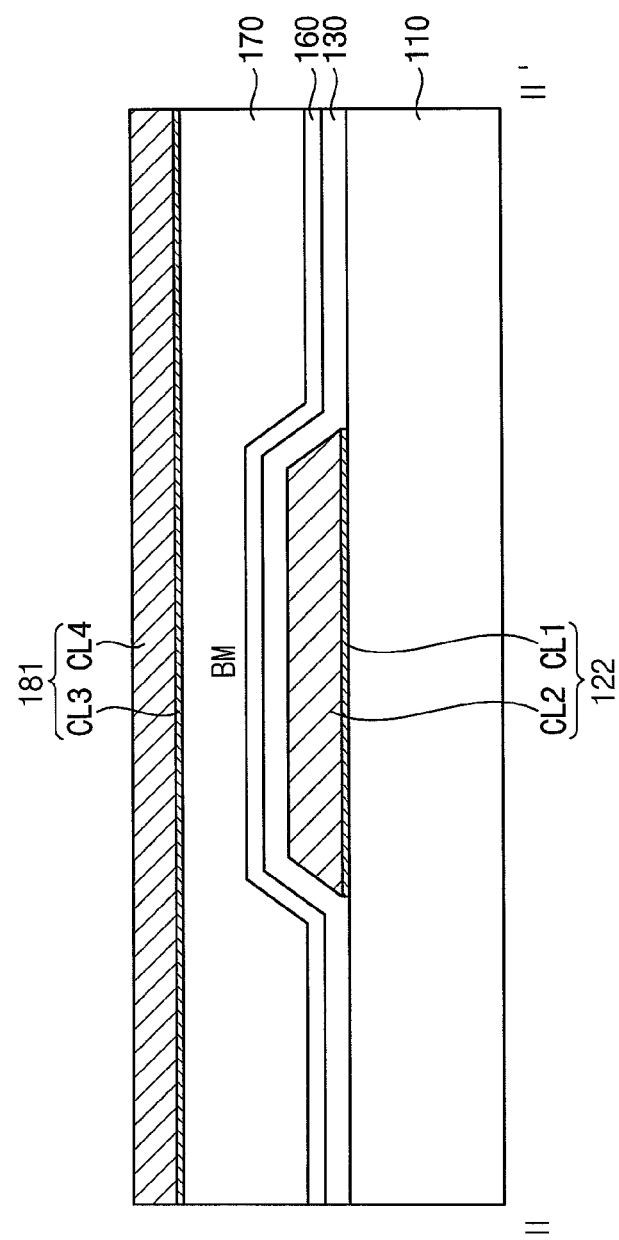

DISPLAY SUBSTRATE

PRIORITY STATEMENT

This application claims priority under 35 U.S.C. § 119 to Korean Patent Application No. 10-2017-0039324, filed on Mar. 28, 2017 in the Korean Intellectual Property Office (KIPO), the disclosure of which is incorporated by reference in its entirety.

BACKGROUND

1. Field

The present disclosure relates to an image display, and more particularly to a display substrate.

2. Description of the Related Art

A typical display apparatus includes a display panel and a display panel driving apparatus.

The display panel includes a lower substrate, an upper substrate, and a liquid crystal layer. The lower substrate includes a first base substrate, a gate line, a data line, a thin film transistor disposed on the first base substrate, and a pixel electrode electrically connected to the thin film transistor. The upper substrate includes a second base substrate facing the first base substrate, a color filter formed on the second base substrate, and a common electrode disposed on the color filter. Alternatively, the color filter may be included in the lower substrate. The liquid crystal layer is formed between the lower substrate and the upper substrate, and includes liquid crystal molecules of which an arrangement is changed by an electric field between the pixel electrode and the common electrode.

The display panel driving apparatus includes a gate driving part, a data driving part, and a timing controlling part. The gate driving part outputs a gate signal to the gate line. The data driving part outputs a data signal to the data line. The timing controlling part controls timings of the gate driving part and the data driving part.

When a resistance of the data line is relatively large, a charge rate of a pixel voltage that is generated by a charge of the data signal to the pixel electrode may be decreased, thereby deteriorating the display quality of the display apparatus.

SUMMARY OF THE INVENTIVE CONCEPT

Exemplary embodiments of the present inventive concept provide a display substrate capable of improving display quality.

According to an exemplary embodiment of the present inventive concept, a display substrate includes a base substrate, a gate electrode, a semiconductor layer, a source electrode, a drain electrode, a first black organic layer, a data line, and a pixel electrode. The gate electrode is disposed on the base substrate. The semiconductor layer is disposed on the gate electrode. The source electrode is disposed on the semiconductor layer. The drain electrode is disposed on the semiconductor layer and is spaced apart from the source electrode. The first black organic layer is disposed on the source electrode and the drain electrode. The data line is disposed on the first black organic layer, and is electrically connected to the source electrode through a contact hole formed through the first black organic layer. The pixel electrode is electrically connected to the drain electrode.

In an exemplary embodiment, an upper surface of the first black organic layer may be substantially flat.

In an exemplary embodiment, the data line may include a material different from a material of the source electrode.

In an exemplary embodiment, a cross-sectional thickness of the data line may be greater than a cross-sectional thickness of the source electrode.

In an exemplary embodiment, a cross-sectional thickness of the data line may be greater than a cross-sectional thickness of the drain electrode.

In an exemplary embodiment, a cross-sectional thickness of the gate electrode may be greater than a cross-sectional thickness of the source electrode.

In an exemplary embodiment, a cross-sectional thickness of the gate electrode may be greater than a cross-sectional thickness of the drain electrode.

In an exemplary embodiment, the display substrate may further include an insulating layer disposed on the data line.

In an exemplary embodiment, the pixel electrode may be disposed on the insulating layer.

In an exemplary embodiment, the display substrate may further include a connection electrode disposed on the first black organic layer, and electrically connecting the pixel electrode to the drain electrode.

In an exemplary embodiment, a cross-sectional thickness of the connection electrode may be greater than a cross-sectional thickness of the source electrode.

In an exemplary embodiment, a cross-sectional thickness of the connection electrode may be greater than a cross-sectional thickness of the drain electrode.

In an exemplary embodiment, the display substrate may further include a second black organic layer disposed on the data line.

In an exemplary embodiment, the pixel electrode may be disposed on the second black organic layer.

In an exemplary embodiment, the display substrate may further include a color filter layer disposed on the data line.

In an exemplary embodiment, the pixel electrode may be disposed on the color filter layer.

According to an exemplary embodiment of the present inventive concept, display substrate includes a base substrate, a gate electrode, a semiconductor layer, a source electrode, a drain electrode, a color filter layer, a data line, and a pixel electrode. The gate electrode is disposed on the base substrate. The semiconductor layer is disposed on the gate electrode. The source electrode is disposed on the semiconductor layer. The drain electrode is disposed on the semiconductor layer and is spaced apart from the source electrode. The color filter layer is disposed on the source electrode and the drain electrode. The data line is disposed on the color filter layer and is electrically connected to the source electrode through a contact hole formed through the color filter layer. The pixel electrode is electrically connected to the drain electrode.

In an exemplary embodiment, an upper surface of the color filter layer may be flat.

In an exemplary embodiment, the display substrate may further include a connection electrode disposed on the color filter layer and electrically connecting the pixel electrode to the drain electrode.

In an exemplary embodiment, the display substrate may further include a black organic layer disposed on the data line.

According to the present inventive concept, a resistance-capacitance delay (i.e., RC delay) of a data signal that is transferred through a data line and a connection electrode decreases. Thus, a charge rate of a pixel voltage that is generated by a charge of the data signal to a pixel may be improved. Thus, display quality of a display apparatus including the display substrate may be improved.

BRIEF DESCRIPTION OF THE DRAWINGS

The above and other features and advantages of the present inventive concept will become more apparent by describing in detailed exemplary embodiments thereof with reference to the accompanying drawings, in which:

FIGS. 4A to 4I are cross-sectional views illustrating a method of manufacturing a display substrate of FIGS. 2 and 3;

DETAILED DESCRIPTION OF THE INVENTIVE CONCEPT

Hereinafter, the present inventive concept will be explained in detail with reference to the accompanying drawings.

Figure 1:
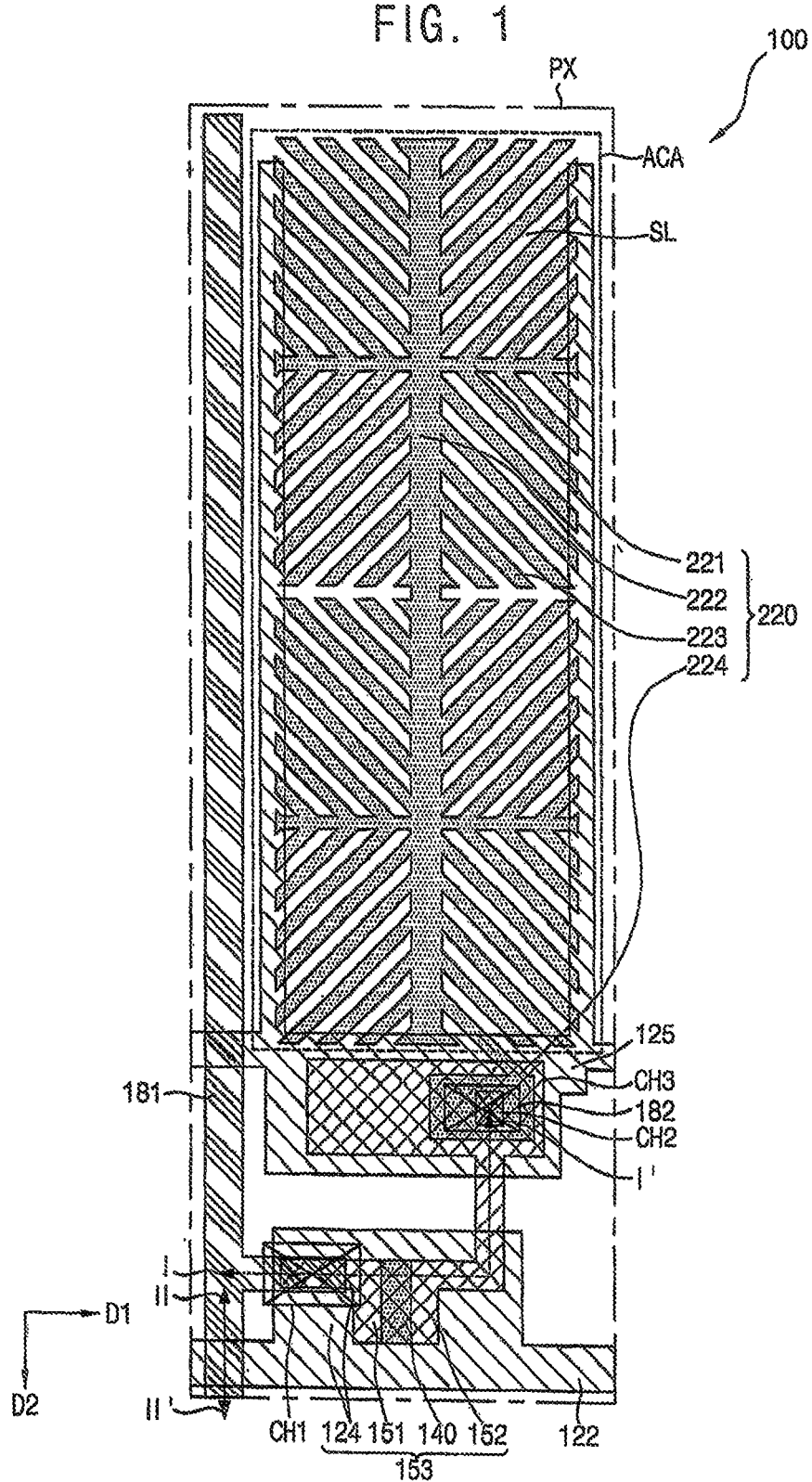
FIG. 1 is a plan view illustrating a display substrate according to an exemplary embodiment of the present inventive concept.
Figure 2:
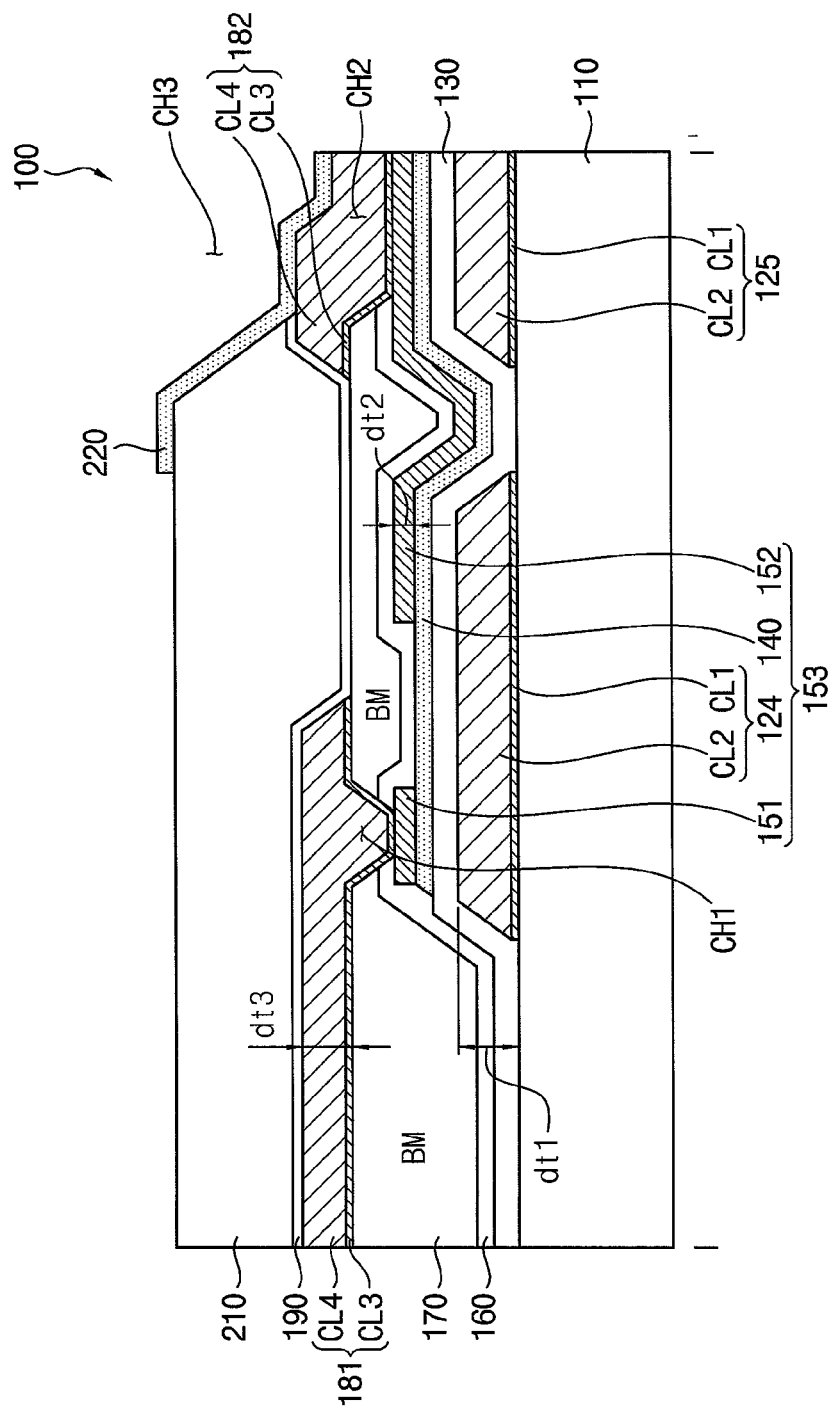
FIG. 2 is a cross-sectional view taken along a line I-I' of FIG. 1.
Figure 3:
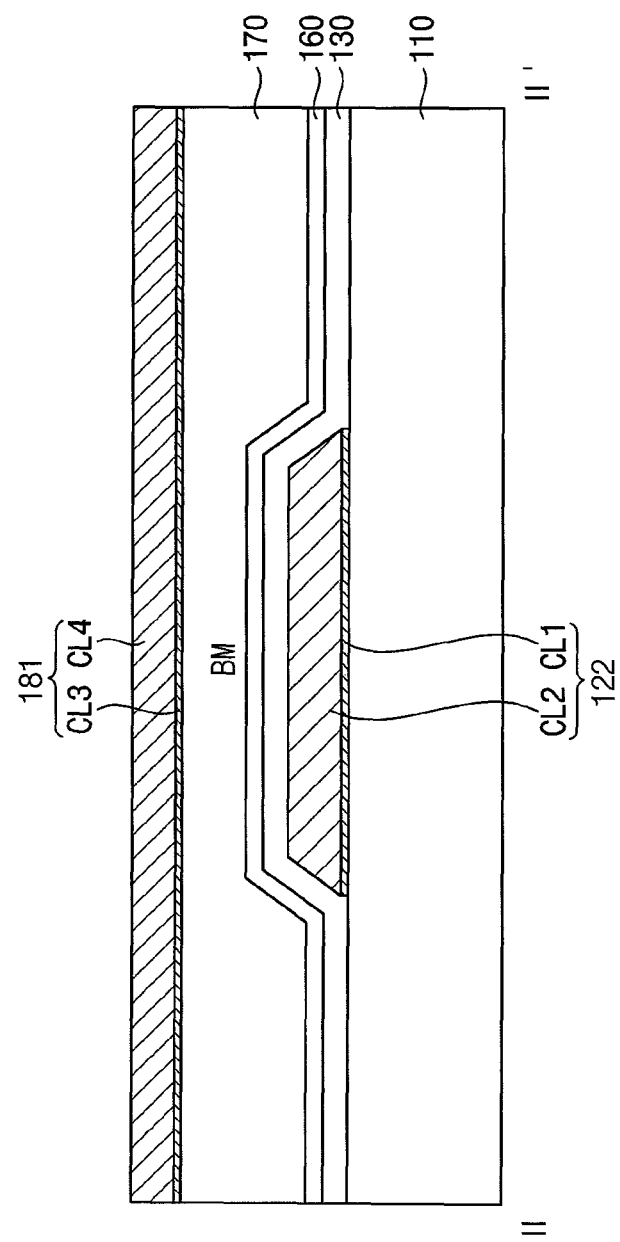
FIG. 3 is a cross-sectional view taken along a line II-II' of FIG. 1.

FIG. 1 is a plan view illustrating a display substrate according to an exemplary embodiment of the present inventive concept. FIG. 2 is a cross-sectional view taken along a line I-I' of FIG. 1. FIG. 3 is a cross-sectional view taken along a line II-II' of FIG. 1.

Referring to FIGS. 1 to 3, the display substrate 100 includes a pixel PX. The display substrate includes an active area ACA in which light is transmitted.

The display substrate 100 includes a base substrate 110, a gate line 122, a data line 181, a storage line 125, a thin film transistor 153, a gate insulating layer 130, a first passivation layer 160, a black organic layer 170, a connection electrode 182, a second passivation layer 190, an insulating layer 210, and a pixel electrode 220.

The base substrate 110 may be a transparent insulating substrate. For example, the base substrate 110 may be a glass substrate, a quartz substrate, or a plastic substrate.

The gate line 122, the storage line 125, and the thin film transistor 153 are disposed on the base substrate 110.

The gate line 122 transfers a gate signal controlling the thin film transistor 153. The thin film transistor is turned on or turned off according to the gate signal transferred by the gate line 122. The gate line 122 extends substantially in a first direction D1.

The storage line 125 extends substantially in the first direction D1. The storage line 125 does not overlap the gate line 122 in a plan view. A capacitance may be formed between the storage line 125 and the pixel electrode 220. In addition, a capacitance may be formed between the storage line 125 and the connection electrode 182. Thus, a rapid voltage decrease of the pixel electrode 220 and the connection electrode 182 may be prevented.

The thin film transistor 153 includes a gate electrode 124, a semiconductor layer 140, a source electrode 151, and a drain electrode 152.

The gate electrode 124 is protruded from the gate line 122 and is connected to the gate line 122. The gate electrode 124 has a first thickness dt1.

The gate line 122, the storage line 125, and the gate electrode 124 may include the same material. Each of the gate line 122, the storage line 125, and the gate electrode 124 may have a single layer structure or a multi layer structure having a plurality of metal layers including materials different from each other. For example, each of the gate line 122, the storage line 125, and the gate electrode 124 may include a first conductive layer CL1 and a second conductive layer CL2.

The first conductive layer CL1 may fix the second conductive layer CL2 to the base substrate 110 so that the second conductive layer CL2 is not separated from the base substrate 110. In addition, the first conductive layer CL1 may transfer the gate signal. The first conductive layer CL1 may include at least one of Indium Zinc Oxide (IZO), Indium Tin Oxide (ITO), Gallium Zinc Oxide (GZO), and Zinc Aluminum Oxide (ZAO). However, the first conductive layer CL1 is not limited thereto, and the first conductive layer CL1 may include titanium (Ti).

The second conductive layer CL2 is disposed on the first conductive layer CL1. The second conductive layer CL2 may transfer the gate signal. A cross-sectional thickness of the second conductive layer CL2 may be greater than that of the first conductive layer CL1. The second conductive layer CL2 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

The gate insulating layer 130 is disposed on the gate line 122, the gate electrode 124, and the storage line 125. The gate insulating layer 130 may include an inorganic insulating material including silicon oxide (SiOx) and/or silicon nitride (SiNx). For example, the gate insulation layer 130 may include silicon oxide (SiOx) having a thickness of about 500 Å. In addition, the gate insulation layer 130 may include a plurality of layers including materials different from each other.

The semiconductor layer 140 is disposed on the gate insulating layer 130. At least some of the semiconductor layer 140 overlaps the gate electrode 124. In addition, at least some of the semiconductor layer 140 overlaps the source electrode 151 and the drain electrode 152. The semiconductor layer 140 may include amorphous silicon, poly silicon, or an oxide semiconductor. For example, the oxide semiconductor may include Zinc Oxide (ZnO), Zinc Tin Oxide (ZTO), Zinc Indium Oxide (ZIO), Indium Oxide (InO), Titanium Oxide (TiO), Indium Gallium Zinc Oxide (IGZO), or Indium Zinc Tin Oxide (IZTO). The semiconductor layer 140 may include one or any mixture of the above-mentioned materials. Preferably, the oxide semiconductor may include Indium Gallium Zinc Oxide (IGZO).

Although not shown, the display substrate 100 may further an ohmic contact member disposed on the semiconductor layer 140. The ohmic contact member may include at least one of a n+ hydride amorphous silicon and silicide in which n-type impurity is doped in a high density.

The source electrode 151 and the drain electrode 152 are disposed on the semiconductor layer 140. The source electrode 151 overlaps one portion of the semiconductor layer 140. The drain electrode 152 overlaps another portion of the semiconductor layer 140. The source electrode 151 is spaced apart from the drain electrode 152.

The source electrode 151 transfers a data signal provided from the data line 181 to the semiconductor layer 140. The drain electrode 152 transfers the data signal provided from the semiconductor layer 140 to the pixel electrode 220 through the connection electrode 182.

Each of the source electrode 151 and the drain electrode 152 may include at least one of titanium (Ti) and molybdenum (Mo). In addition, each of the source electrode 151 and the drain electrode 152 has a second thickness dt2. In one embodiment, the second thickness dt2 of each of the source electrode 151 and the drain electrode 152 is less than the first thickness dt1 of the gate electrode 124. For example, the second thickness dt2 of each of the source electrode 151 and the drain electrode 152 may be less than a half of the first thickness dt1 of the gate electrode 124.

The first passivation layer 160 is disposed on the source electrode 151 and the drain electrode 152. The first passivation layer 160 may include an inorganic insulating material. The first passivation layer 160 may cover the thin film transistor 153. Thus, the first passivation layer 160 may prevent an inflow of the black organic layer 170 into the semiconductor layer 140.

The black organic layer 170 may include an organic insulating material. Specifically, the black organic layer 170 may include a black matrix (BM) material. An upper surface of the black organic layer 170 is substantially flat. Thus, the black organic layer 170 may decrease and planarize a local step difference generated by elements disposed between the base substrate 110 and the black organic layer 170. The black organic layer 170 may be disposed in an area of the pixel PX except for the active area ACA.

The data line 181 extends substantially in a second direction D2 substantially perpendicular to the first direction D1. The data line 181 receives the data signal from a data driving part and transfers the data signal to the source electrode 151. The data line 181 is electrically connected to the source electrode 151 through a first contact hole CH1 formed through the black organic layer 170. The data line 181 includes a material different from that of the source electrode 151. In addition, the data line 181 has a third thickness dt3. In one embodiment, the third thickness dt3 of the data line 181 is greater than the second thickness dt2 of each of the source electrode 151 and the drain electrode 152. For example, the second thickness dt2 of each of the source electrode 151 and the drain electrode 152 may be less than a half of the third thickness dt3 of the data line 181. Since the third thickness dt3 of the data line 181 is greater than the second thickness dt2 of each of the source electrode 151 and the drain electrode 152, a resistance of the data line 181 is comparatively low. Thus, a charge rate of a pixel voltage that is generated by a charge of the data signal transferred through the data line 181 to the pixel PX may be improved.

The connection electrode 182 is disposed on the black organic layer 170. In addition, the connection electrode 182 is disposed between the pixel electrode 220 and the drain electrode 152. The connection electrode 182 may be electrically connected to the drain electrode 152 through a second contact hole CH2 formed through the black organic layer 170. The connection electrode 182 receives the data signal from the drain electrode 152 and transfers the data signal to the pixel electrode 220.

The data line 181 and the connection electrode 182 may include the same material. Each of the data line 181 and the connection electrode 182 may have a single layer structure or a multi layer structure having a plurality of metal layers including materials different from each other. For example, each of the data line 181 and the connection electrode 182 may include a third conductive layer CL3 and a fourth conductive layer CL4.

The third conductive layer CL3 may fix the fourth conductive layer CL4 to the black organic layer 170, the source electrode 151, and the drain electrode 152 so that the fourth conductive layer CL4 is not separated from the black organic layer 170, the source electrode 151, and the drain electrode 152. In addition, the third conductive layer CL3 may transfer the data signal. The third conductive layer CL3 may include at least one of Indium Zinc Oxide (IZO), Indium Tin Oxide (ITO), Gallium Zinc Oxide (GZO), and Zinc Aluminum Oxide (ZAO). However, the third conductive layer CL3 is not limited thereto, and the third conductive layer CL3 may include titanium (Ti).

The fourth conductive layer CL4 is disposed on the third conductive layer CL3. The fourth conductive layer CL4 may transfer the data signal. A cross-sectional thickness of the fourth conductive layer CL4 may be greater than that of the third conductive layer CL3. The fourth conductive layer CL4 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

The second passivation layer 190 is disposed on the data line 181 and the connection electrode 182. The second passivation layer 190 may include an inorganic insulating material. The second passivation layer 190 may cover the data line 181 and the connection electrode 182. Thus, the second passivation layer 190 may prevent an inflow of the insulating layer 210 into the data line 181 and the connection electrode 182.

The insulating layer 210 is disposed on the second passivation layer 190. The insulating layer 210 may include an organic material. An upper surface of the insulating layer 210 is substantially flat. Thus, the insulating layer 210 may decrease and planarize a local step difference generated by elements disposed between the base substrate 110 and the insulating layer 210.

The pixel electrode 220 is disposed on the insulating layer 210. The pixel electrode 220 may include a transparent conductive material. For example, the pixel electrode 220 may include Indium Tin Oxide (ITO) or Indium Zinc Oxide (IZO). The pixel electrode 220 may be electrically connected to the connection electrode 182 through a third contact hole CH3 formed through the insulating layer 210. Thus, the pixel electrode 220 may receive the data signal from the connection electrode 182 that is electrically connected to the drain electrode 152.

The pixel electrode 220 may include a first stem electrode 221, a second stem electrode 222, a branch electrode 223, and an extension electrode 224.

The first stem electrode 221 may extend in the first direction D1 in the active area ACA. The number of the first stem electrode 221 may be N (N is a natural number).

The second stem electrode 222 may extend in the second direction D2 in the active area ACA. Since the first stem electrode 221 extends substantially in the first direction D1 and the second stem electrode 222 extends substantially in the second direction D2 in the active area ACA, the first stem electrode 221 and the second stem electrode 222 may cross each other in the active area ACA. The number of the second stem electrode 222 may be M (M is a natural number).

The branch electrode 223 is disposed in the active area ACA. The branch electrode 223 may extend from the first stem electrode 221 or the second stem electrode 222. The branch electrode 223 may extend in a direction far from a point in which the first stem electrode 221 and the second stem electrode 222 cross. The branch electrode 223 may extend in an oblique direction from the first direction D1. In addition, the branch electrode 223 may extend in an oblique direction from the second direction D2.

The extension electrode 224 may extend from the branch electrode 223. Specifically, the extension electrode 224 may extend from the branch electrode 223 to an outside of the active area ACA. The extension electrode 224 may overlap the third contact hole CH3 formed through the insulating layer 210. The extension electrode 224 of the pixel electrode 220 may be electrically connected to the connection electrode 182. Thus, the extension electrode 224 of the pixel electrode 220 may receive the data signal from the connection electrode 182 that is electrically connected to the drain electrode 152.

The pixel electrode 220 may include a slit SL. A regular pattern is formed in the pixel electrode 220 due to the slit SL. The slit SL may correspond to an opening portion among the first stem electrode 221, the second stem electrode 222, and the branch electrode 223. When the display substrate 100 has a liquid crystal layer including liquid crystal molecules, an inclined direction and an inclined level of the liquid crystal molecules in the liquid crystal display panel may be controlled according to a shape and a pattern of the slit SL in the pixel electrode 220.

According to the display substrate 100, the black organic layer 170 is disposed between the gate electrode 124 and the data line 181, and the black organic layer 170 is disposed between the gate electrode 124 and the connection electrode 182. Therefore, a distance between the gate electrode 124 and the data line 181 increases by the black organic layer 170, and a distance between the gate electrode 124 and the connection electrode 182 increases by the black organic layer 170. Thus, a capacitance between the gate electrode 124 and the data line 181 decreases, and a capacitance between the gate electrode 124 and the connection electrode 182 decreases.

In addition, when a dielectric constant of the black organic layer 170 is less than that of each of the gate electrode 124, the data line 181, and the connection electrode 182, a capacitance between the gate electrode 124 and the data line 181 decreases, and a capacitance between the gate electrode 124 and the connection electrode 182 decreases.

Therefore, a resistance-capacitance delay (i.e., RC delay) of the data signal that is transferred through the data line 181 and the connection electrode 182 decreases. Thus, a charge rate of a pixel voltage that is generated by a charge of the data signal to the pixel PX may be improved.

In addition, since the data line 181 and the connection electrode 182 are disposed on the black organic layer 170 of which the upper surface is substantially flat, in order to decrease of a resistance of each of the gate electrode 124, the gate line 122, the data line 181, and the connection electrode 182, each of the gate electrode 124, the gate line 122, the data line 181, and the connection electrode 182 may be thickly formed compared to each of the source electrode 151, the drain electrode 152, and the semiconductor layer 140. Specifically, since the black organic layer 170 of which the upper surface is substantially flat is disposed on the gate line 122 and the gate electrode 124, although the gate line 122 and the gate electrode 124 are formed comparatively thickly, an effect of a step difference formed due to the gate line 122 and the gate electrode 124 may be minimized In addition, since the data line 181 includes the material different from that of each of the source electrode 151 and the drain electrode 152, the data line 181 may be formed comparatively thickly.

As described above, since the resistance of each of the gate electrode 124, the gate line 122, the data line 181, and the connection electrode 182 decreases, an RC delay of the gate signal may decrease, and an RC delay of the data signal may decrease. Thus, a charge rate of a pixel voltage that is generated by a charge of the data signal to the pixel PX may be improved.

Therefore, display quality of a display apparatus including the display substrate 100 may be improved.

FIGS. 4A to 4I are cross-sectional views illustrating a method of manufacturing the display substrate 100 of FIGS. 2 and 3.

Figure 4B:
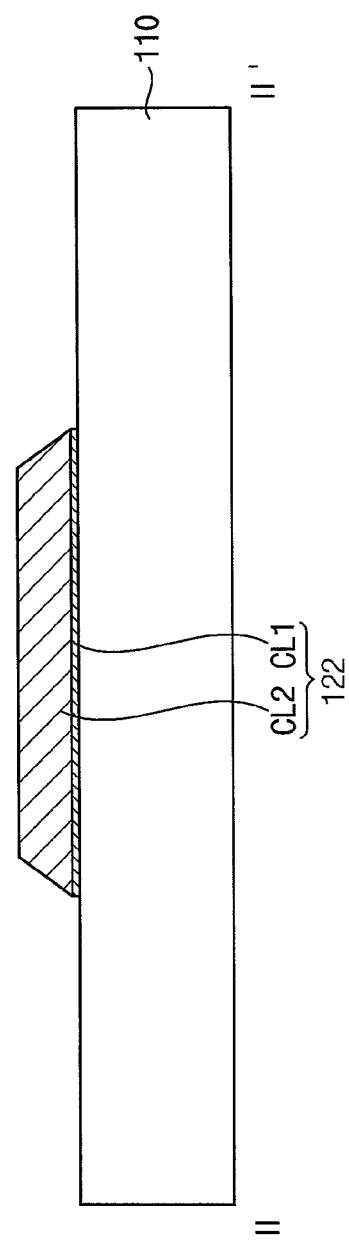

Referring to FIGS. 4A and 4B, the gate electrode 124 and the storage line 125 are formed on the base substrate 110. Each of the gate electrode 124 and the storage line 125 may include the first conductive layer CL1 and the second conductive layer CL2.

The first conductive layer CL1 may fix the second conductive layer CL2 to the base substrate 110 so that the second conductive layer CL2 is not separated from the base substrate 110. In addition, the first conductive layer CL1 may transfer the gate signal. The first conductive layer CL1 may include at least one of Indium Zinc Oxide (IZO), Indium Tin Oxide (ITO), Gallium Zinc Oxide (GZO), and Zinc Aluminum Oxide (ZAO). However, the first conductive layer CL1 is not limited thereto, and the first conductive layer CL1 may include titanium (Ti).

The second conductive layer CL2 is disposed on the first conductive layer CL1. The second conductive layer CL2 may transfer the gate signal. A cross-sectional thickness of the second conductive layer CL2 may be greater than that of the first conductive layer CL1. The second conductive layer CL2 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

Each of the gate electrode 124 and the storage line 125 may be formed by at least one of a sputtering method, a Chemical Vapor Deposition (CVD) method, and a Plasma Enhanced Chemical Vapor Deposition (PECVD) method.

For example, two metal layers are disposed, a photoresist composition is spread on the two metal layers, the photoresist composition is exposed to obtain a pattern corresponding to a shape of each of the gate electrode 124 and the storage line 125, and two metal layers are etched to form the gate electrode 124 and the storage line 125.

Figure 4C:
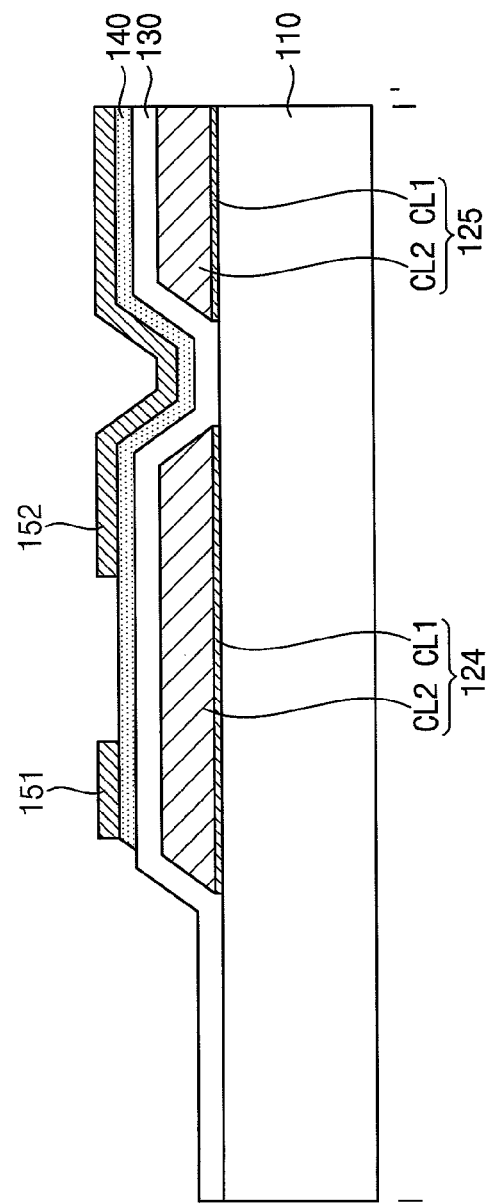
Figure 4D:
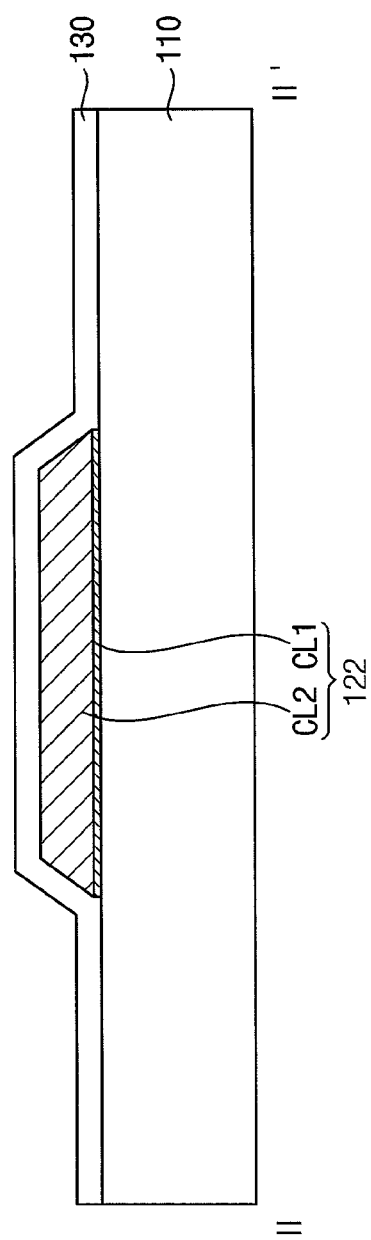

Referring to FIGS. 4C and 4D, the gate insulating layer 130, the semiconductor layer 140, the source electrode 151, and the drain electrode 152 are formed.

The gate insulating layer 130 is disposed on the gate line 122, the gate electrode 124 and the storage line 125. The gate insulating layer 130 may include an inorganic insulating material including silicon oxide (SiOx) and/or silicon nitride (SiNx). For example, the gate insulation layer 130 may include silicon oxide (SiOx) having a thickness of about 500 Å. In addition, the gate insulation layer 130 may include a plurality of layers including materials different from each other.

The semiconductor layer 140 is disposed on the gate insulating layer 130. At least some of the semiconductor layer 140 overlaps the gate electrode 124. In addition, at least some of the semiconductor layer 140 overlaps the source electrode 151 and the drain electrode 152. The semiconductor layer 140 may include amorphous silicon, poly silicon, or an oxide semiconductor. For example, the oxide semiconductor may include Zinc Oxide (ZnO), Zinc Tin Oxide (ZTO), Zinc Indium Oxide (ZIO), Indium Oxide (InO), Titanium Oxide (TiO), Indium Gallium Zinc Oxide (IGZO) or Indium Zinc Tin Oxide (IZTO). The semiconductor layer 140 may include one or any mixture of the above-mentioned materials. Preferably, the oxide semiconductor may include Indium Gallium Zinc Oxide (IGZO).

The source electrode 151 and the drain electrode 152 are disposed on the semiconductor layer 140. The source electrode 151 overlaps one portion of the semiconductor layer 140. The drain electrode 152 overlaps another portion of the semiconductor layer 140. The source electrode 151 is spaced apart from the drain electrode 152.

The source electrode 151 transfers the data signal provided from the data line 181 to the semiconductor layer 140. The drain electrode 152 transfers the data signal provided from the semiconductor layer 140 to the pixel electrode 220 through the connection electrode 182.

Each of the source electrode 151 and the drain electrode 152 may include at least one of titanium (Ti) and molybdenum (Mo). In addition, each of the source electrode 151 and the drain electrode 152 has the second thickness dt2. In one embodiment, the second thickness dt2 of each of the source electrode 151 and the drain electrode 152 is less than the first thickness dt1 of the gate electrode 124. For example, the second thickness dt2 of each of the source electrode 151 and the drain electrode 152 may be less than a half of the first thickness dt1 of the gate electrode 124.

The semiconductor layer 140, the source electrode 151, and the drain electrode 152 may be formed simultaneously using the same mask.

For example, a semiconductor material layer is disposed on the gate insulating layer 130, a metal layer forming the source electrode 151 and the drain electrode 152 are disposed on the semiconductor material layer, and a photoresist composition is spread on the metal layer. The photoresist composition is exposed using a slit mask to have a thickness in an area corresponding to the source electrode 151 and the drain electrode 152 greater than a thickness in an area corresponding to a channel. The photoresist composition is removed in an area except for the areas corresponding to the source electrode 151, the drain electrode 152, and the channel, and the metal layer and the semiconductor material layer are sequentially etched to form the source electrode 151, the drain electrode 152, and the semiconductor layer 140.

Figure 4E:
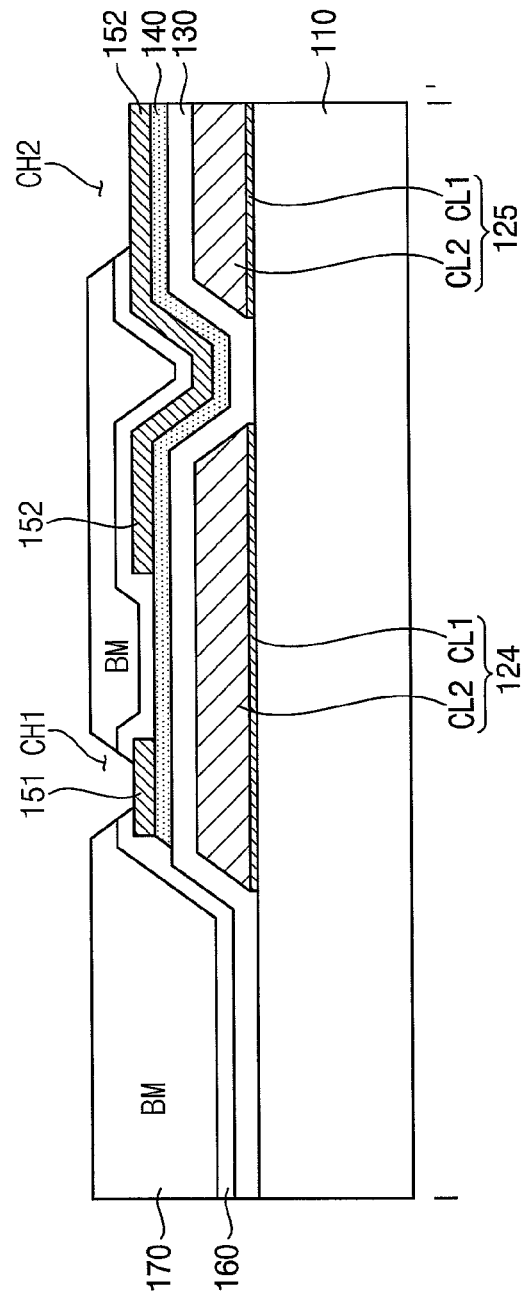
Figure 4F:
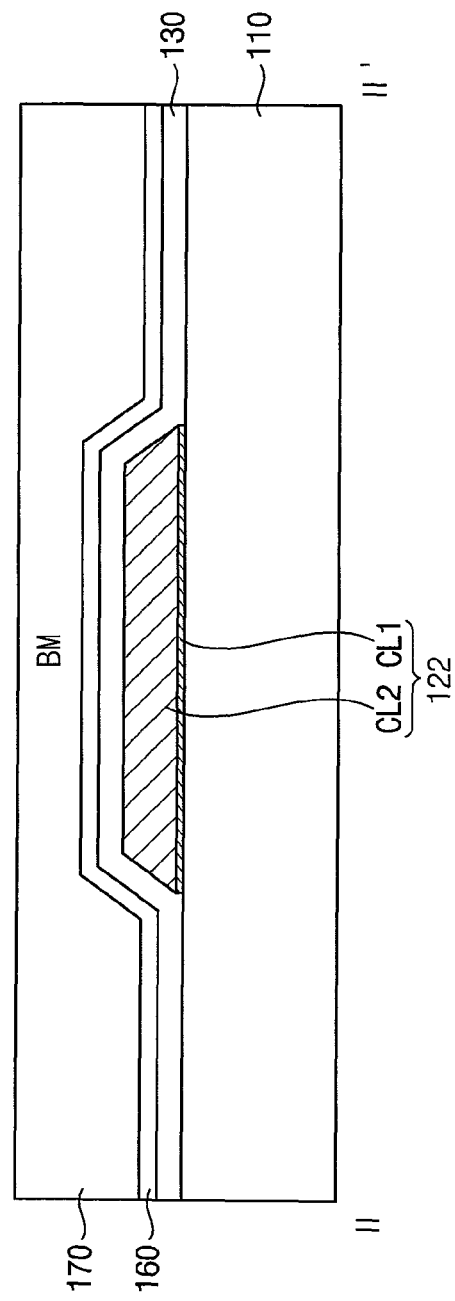

FIGS. 4E and 4F, the first passivation layer 160 and the black organic layer 170 are formed.

Specifically, a first passivation material layer forming the first passivation layer 160 is disposed on the source electrode 151 and the drain electrode 152, and a black organic insulating material layer forming the black organic insulating layer is disposed on the first passivation material layer. The first passivation layer 160 and the black organic layer 170 may be formed by exposing the first passivation material layer and the black organic insulating material layer using a mask having a pattern corresponding to the first contact hole CH1 and the second contact hole CH2 in the first passivation material layer and the black organic insulating material layer.

The first passivation layer 160 is disposed on the source electrode 151 and the drain electrode 152. The first passivation layer 160 may include an inorganic insulating material. The first passivation layer 160 may cover the thin film transistor 153. Thus, the first passivation layer 160 may prevent an inflow of the black organic layer 170 into the semiconductor layer 140.

The black organic layer 170 may include an organic insulating material. Specifically, the black organic layer 170 may include a black matrix (BM) material. An upper surface of the black organic layer 170 is substantially flat. Thus, the black organic layer 170 may decrease and planarize a local step difference generated by elements disposed between the base substrate 110 and the black organic layer 170. The black organic layer 170 may be disposed in an area of the pixel PX except for the active area ACA.

Figure 4G:
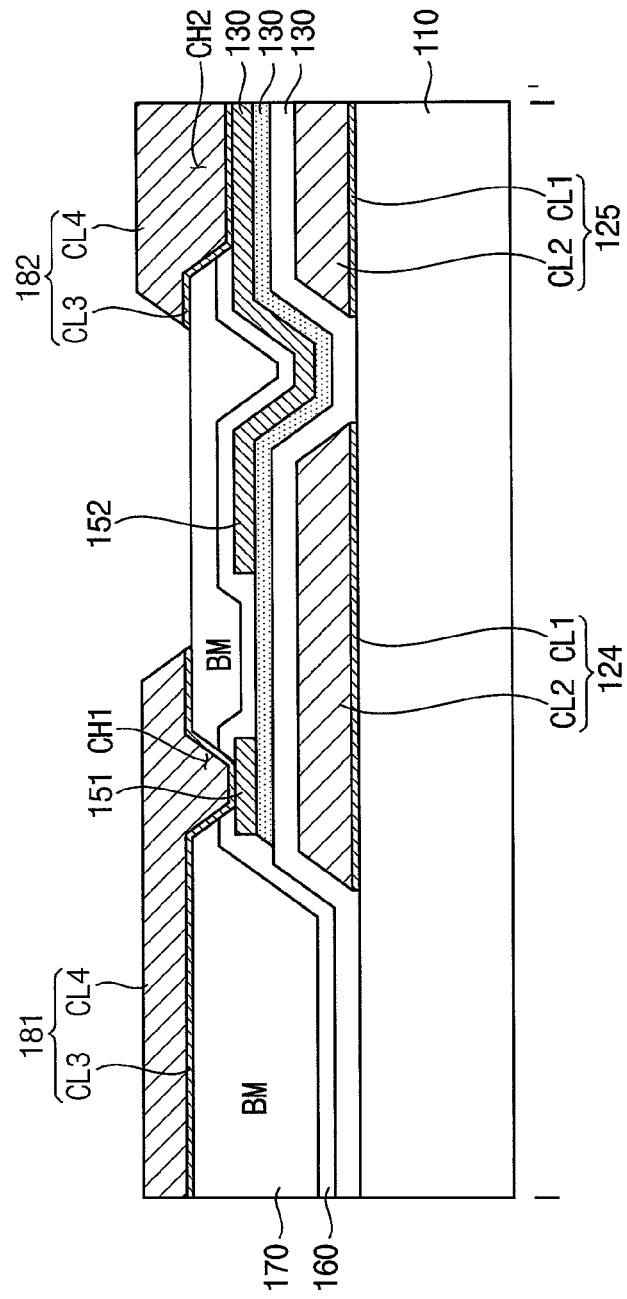
Figure 41:
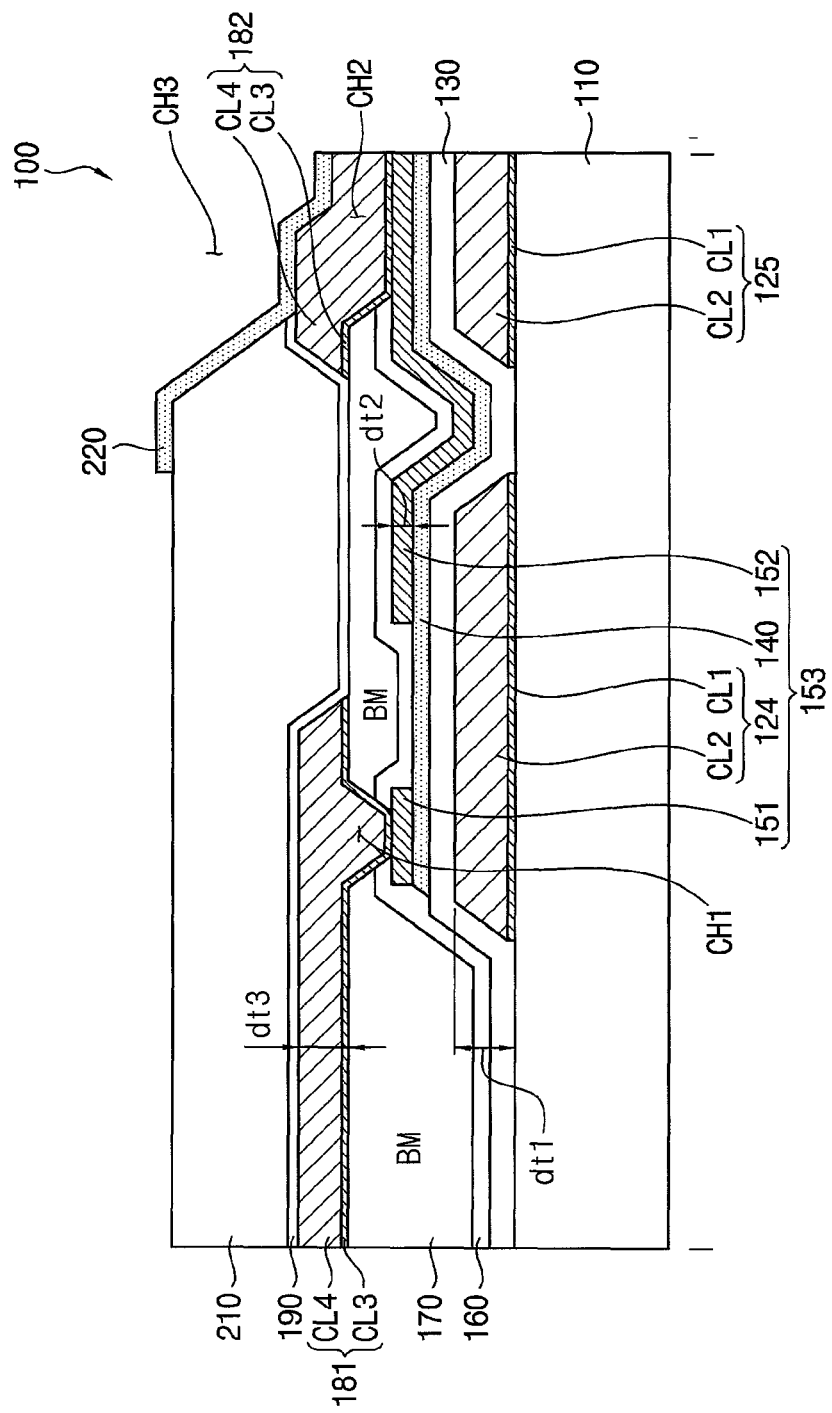

Referring to FIGS. 4G and 4H, the data line 181 and the connection electrode 182 are formed.

The data line 181 extends substantially in the second direction D2 substantially perpendicular to the first direction D1. The data line 181 receives the data signal from a data driving part and transfers the data signal to the source electrode 151. The data line 181 is electrically connected to the source electrode 151 through the first contact hole CH1 formed through the black organic layer 170. The data line 181 includes a material different from that of the source electrode 151. In addition, the data line 181 has the third thickness dt3. In one embodiment, the third thickness dt3 of the data line 181 is greater than the second thickness dt2 of each of the source electrode 151 and the drain electrode 152. For example, the second thickness dt2 of each of the source electrode 151 and the drain electrode 152 may be less than a half of the third thickness dt3 of the data line 181. Since the third thickness dt3 of the data line 181 is greater than the second thickness dt2 of each of the source electrode 151 and the drain electrode 152, a resistance of the data line 181 is comparatively low. Thus, a charge rate of a pixel voltage that is generated by a charge of the data signal transferred through the data line 181 to the pixel PX may be improved.

The connection electrode 182 is disposed on the black organic layer 170. In addition, the connection electrode 182 is disposed between the pixel electrode 220 and the drain electrode 152. The connection electrode 182 may be electrically connected to the drain electrode 152 through the second contact hole CH2 formed through the black organic layer 170. The connection electrode 182 receives the data signal from the drain electrode 152 and transfers the data signal to the pixel electrode 220.

The data line 181 and the connection electrode 182 may include the same material. Each of the data line 181 and the connection electrode 182 may have a single layer structure or a multi layer structure having a plurality of metal layers including materials different from each other. For example, each of the data line 181 and the connection electrode 182 may include the third conductive layer CL3 and the fourth conductive layer CL4.

The third conductive layer CL3 may fix the fourth conductive layer CL4 to the black organic layer 170, the source electrode 151, and the drain electrode 152 so that the fourth conductive layer CL4 is not separated from the black organic layer 170, the source electrode 151 and the drain electrode 152. In addition, the third conductive layer CL3 may transfer the data signal. The third conductive layer CL3 may include at least one of Indium Zinc Oxide (IZO), Indium Tin Oxide (ITO), Gallium Zinc Oxide (GZO) and Zinc Aluminum Oxide (ZAO). However, the third conductive layer CL3 is not limited thereto, and the third conductive layer CL3 may include titanium (Ti).

The fourth conductive layer CL4 is disposed on the third conductive layer CL3. The fourth conductive layer CL4 may transfer the data signal. A cross-sectional thickness of the fourth conductive layer CL4 may be greater than that of the third conductive layer CL3. The fourth conductive layer CL4 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

Each of the data line 181 and the connection electrode 182 may be formed by at least one of a sputtering method, a Chemical Vapor Deposition (CVD) method, and a Plasma Enhanced Chemical Vapor Deposition (PECVD) method.

For example, two metal layers are disposed, a photoresist composition is spread on the two metal layers, the photoresist composition is exposed to obtain a pattern corresponding to a shape of each of the data line 181 and the connection electrode 182, and two metal layers are sequentially etched to form the data line 181 and the connection electrode 182.

Referring to FIG. 4I, the second passivation layer 190, the insulating layer 210, and the pixel electrode 220 are formed on the data line 181 and the connection electrode 182. Thus, the display substrate 100 is formed.

The second passivation layer 190 is disposed on the data line 181 and the connection electrode 182. The second passivation layer 190 may include an inorganic insulating material. The second passivation layer 190 may cover the data line 181 and the connection electrode 182. Thus, the second passivation layer 190 may prevent an inflow of the insulating layer 210 into the data line 181 and the connection electrode 182.

The insulating layer 210 is disposed on the second passivation layer 190. The insulating layer 210 may include an organic material. An upper surface of the insulating layer 210 is substantially flat. Thus, the insulating layer 210 may decrease and planarize a local step difference generated by elements disposed between the base substrate 110 and the insulating layer 210.

The pixel electrode 220 is disposed on the insulating layer 210. The pixel electrode 220 may include a transparent conductive material. For example, the pixel electrode 220 may include Indium Tin Oxide (ITO) or Indium Zinc Oxide (IZO). The pixel electrode 220 may be electrically connected to the connection electrode 182 through the third contact hole CH3 formed through the insulating layer 210. Thus, the pixel electrode 220 may receive the data signal from the connection electrode 182 that is electrically connected to the drain electrode 152.

According to the present exemplary embodiment, the RC delay of the data signal that is transferred through the data line 181 and the connection electrode 182 decreases. Thus, a charge rate of a pixel voltage that is generated by a charge of the data signal to the pixel PX may be improved.

In addition, the black organic layer 170 capable of functioning as a black matrix (BM) is disposed in the display substrate 100. In one embodiment, the display substrate 100 including the black matrix may be combined with a facing substrate including another black matrix. In this case, a light leakage that can occur due to a misalignment between the facing substrate and the display substrate 100 may be prevented.

In addition, since the display substrate 100 includes the black organic layer 170, when the display substrate 100 is included in a flip display panel that displays an image to a rear side of the flip display panel, a reflectivity of the flip display panel may decrease.

Thus, display quality of a display apparatus including the display substrate 100 may be improved.

Figure 5:
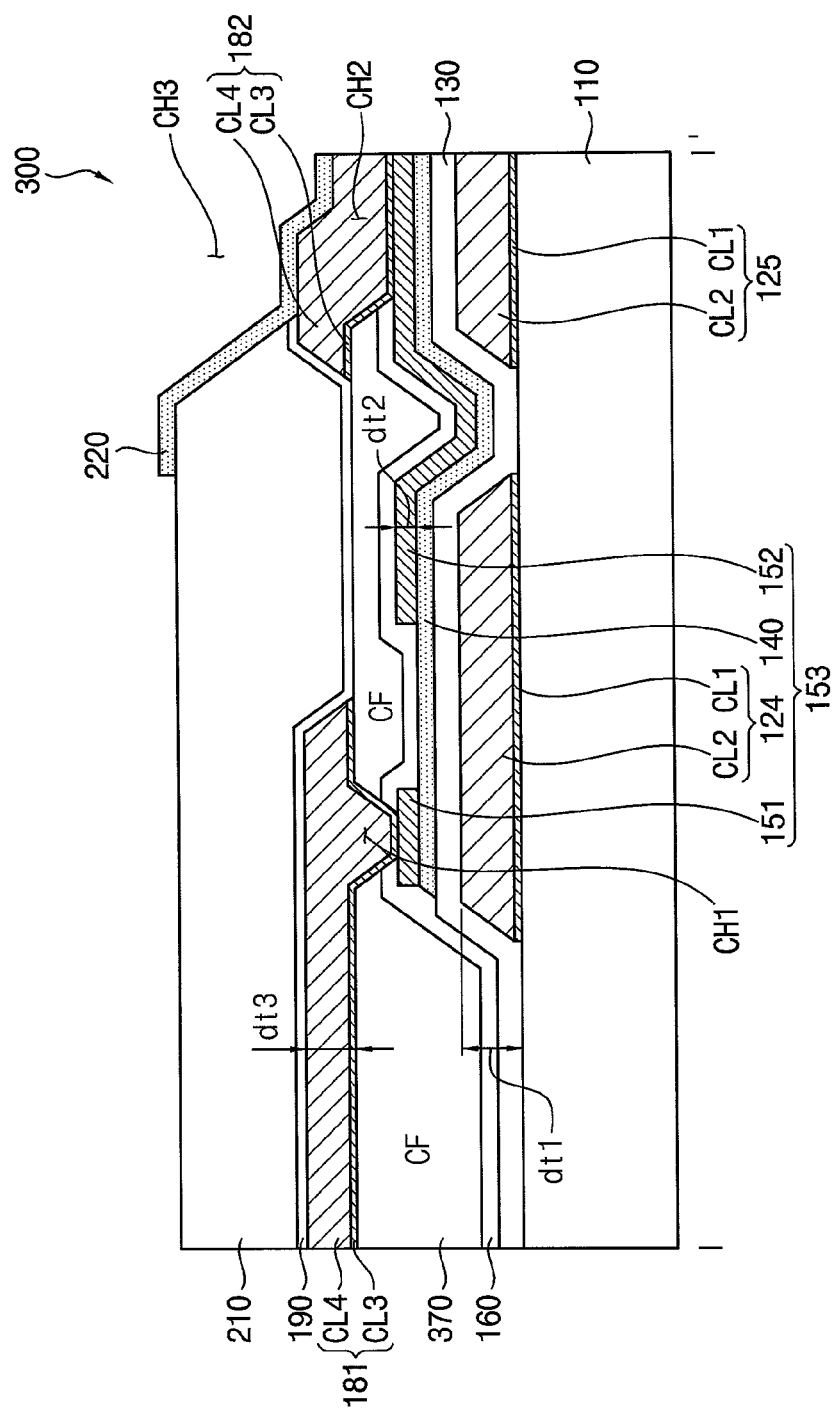
FIG. 5 is a cross-sectional view taken along a line I-I' of FIG. 1 according to an exemplary embodiment of the present inventive concept.
Figure 6:
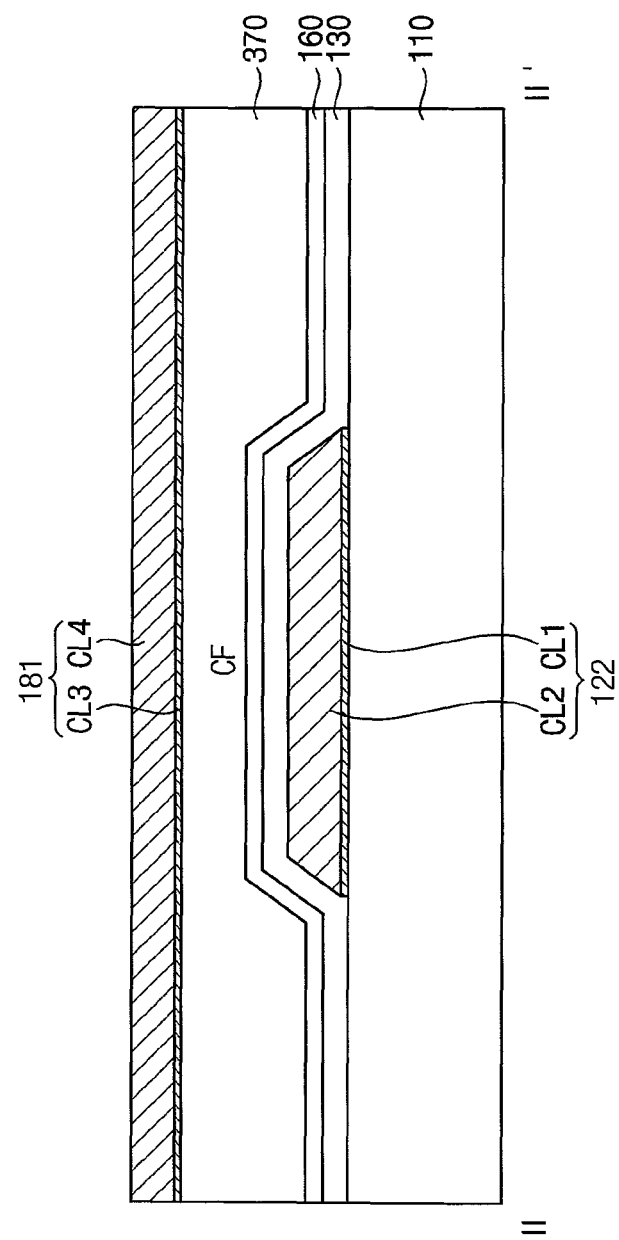
FIG. 6 is a cross-sectional view taken along a line II-IP of FIG. 1 according to an exemplary embodiment of the present inventive concept.

FIG. 5 is a cross-sectional view taken along a line I-I' of FIG. 1 according to an exemplary embodiment of the present inventive concept. FIG. 6 is a cross-sectional view taken along a line II-II' of FIG. 1 according to an exemplary embodiment of the present inventive concept.

The display substrate 300 according to the present exemplary embodiment illustrated in FIGS. 5 and 6 is substantially the same as the display substrate 100 according to the previous exemplary embodiment illustrated in FIGS. 1 to 3 except for a color filter layer 370. Thus, the same reference numerals may be used to refer to same or like elements as those described in the previous exemplary embodiment and any further repetitive explanation concerning the above elements may be omitted.

Referring to FIGS. 1, 5 and 6, the display substrate 300 includes the base substrate 110, the gate line 122, the data line 181, the storage line 125, the thin film transistor 153, the gate insulating layer 130, the first passivation layer 160, the color filter layer 370, the connection electrode 182, the second passivation layer 190, the insulating layer 210, and the pixel electrode 220.

The color filter layer 370 may include an organic insulating material. Specifically, the color filter layer 370 may include a color filter material. The color filter layer 370 may include at least one of a red color filter layer, a green color filter layer, a blue color filter layer, and a white color filter layer. An upper surface of the color filter layer 370 is substantially flat. Thus, the color filter layer 370 may decrease and planarize a local step difference generated by elements disposed between the base substrate 110 and the color filter layer 370. The color filter layer 370 may be disposed in a whole area of the pixel PX including the active area ACA.

The data line 181 extends substantially in the second direction D2 substantially perpendicular to the first direction D1. The data line 181 receives the data signal from a data driving part and transfers the data signal to the source electrode 151. The data line 181 is electrically connected to the source electrode 151 through a first contact hole CH1 formed through the color filter layer 370. The data line 181 includes a material different from that of the source electrode 151. In addition, the data line 181 has the third thickness dt3. In one embodiment, the third thickness dt3 of the data line 181 is greater than the second thickness dt2 of each of the source electrode 151 and the drain electrode 152. For example, the second thickness dt2 of each of the source electrode 151 and the drain electrode 152 may be less than a half of the third thickness dt3 of the data line 181. Since the third thickness dt3 of the data line 181 is greater than the second thickness dt2 of each of the source electrode 151 and the drain electrode 152, a resistance of the data line 181 is comparatively low. Thus, a charge rate of a pixel voltage that is generated by a charge of the data signal transferred through the data line 181 to the pixel PX may be improved.

The connection electrode 182 is disposed on the color filter layer 370. In addition, the connection electrode 182 is disposed between the pixel electrode 220 and the drain electrode 152. The connection electrode 182 may be electrically connected to the drain electrode 152 through a second contact hole CH2 formed through the color filter layer 370. The connection electrode 182 receives the data signal from the drain electrode 152 and transfers the data signal to the pixel electrode 220.

The data line 181 and the connection electrode 182 may include the same material. Each of the data line 181 and the connection electrode 182 may have a single layer structure or a multi layer structure having a plurality of metal layers including materials different from each other. For example, each of the data line 181 and the connection electrode 182 may include a third conductive layer CL3 and a fourth conductive layer CL4.

The third conductive layer CL3 may fix the fourth conductive layer CL4 to the color filter layer 370, the source electrode 151, and the drain electrode 152 so that the fourth conductive layer CL4 is not separated from the color filter layer 370, the source electrode 151, and the drain electrode 152. In addition, the third conductive layer CL3 may transfer the data signal. The third conductive layer CL3 may include at least one of Indium Zinc Oxide (IZO), Indium Tin Oxide (ITO), Gallium Zinc Oxide (GZO), and Zinc Aluminum Oxide (ZAO). However, the third conductive layer CL3 is not limited thereto, and the third conductive layer CL3 may include titanium (Ti).

The fourth conductive layer CL4 is disposed on the third conductive layer CL3. The fourth conductive layer CL4 may transfer the data signal. A cross-sectional thickness of the fourth conductive layer CL4 may be greater than that of the third conductive layer CL3. The fourth conductive layer CL4 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

According to the display substrate 300, the color filter layer 370 is disposed between the gate electrode 124 and the data line 181, and the color filter layer 370 is disposed between the gate electrode 124 and the connection electrode 182. Therefore, a distance between the gate electrode 124 and the data line 181 increases by the color filter layer 370, and a distance between the gate electrode 124 and the connection electrode 182 increases by the color filter layer 370. Thus, a capacitance between the gate electrode 124 and the data line 181 decreases, and a capacitance between the gate electrode 124 and the connection electrode 182 decreases.

In addition, when a dielectric constant of the color filter layer 370 is less than that of each of the gate electrode 124, the data line 181 and the connection electrode 182, a capacitance between the gate electrode 124 and the data line 181 decreases, and a capacitance between the gate electrode 124 and the connection electrode 182 decreases.

Therefore, a resistance-capacitance delay (i.e., RC delay) of the data signal that is transferred through the data line 181 and the connection electrode 182 decreases. Thus, a charge rate of a pixel voltage that is generated by a charge of the data signal to the pixel PX may be improved.

In addition, since the data line 181 and the connection electrode 182 are disposed on the color filter layer 370 of which the upper surface is substantially flat, in order to decrease of a resistance of each of the gate electrode 124, the gate line 122, the data line 181, and the connection electrode 182, each of the gate electrode 124, the gate line 122, the data line 181, and the connection electrode 182 may be thickly formed compared to each of the source electrode 151, the drain electrode 152, and the semiconductor layer 140. Specifically, since the color filter layer 370 of which the upper surface is substantially flat is disposed on the gate line 122 and the gate electrode 124, although the gate line 122 and the gate electrode 124 are formed comparatively thickly, an effect of a step difference formed due to the gate line 122 and the gate electrode 124 may be minimized In addition, since the data line 181 includes the material different from that of each of the source electrode 151 and the drain electrode 152, the data line 181 may be formed comparatively thickly.

As described above, since the resistance of each of the gate electrode 124, the gate line 122, the data line 181, and the connection electrode 182 decreases, an RC delay of the gate signal may decrease, and an RC delay of the data signal may decrease. Thus, a charge rate of a pixel voltage that is generated by a charge of the data signal to the pixel PX may be improved.

Therefore, display quality of a display apparatus including the display substrate 300 may be improved.

FIGS. 7A to 7G are cross-sectional views illustrating a method of manufacturing the display substrate 300 of FIGS. 5 and 6.

Figure 7A:
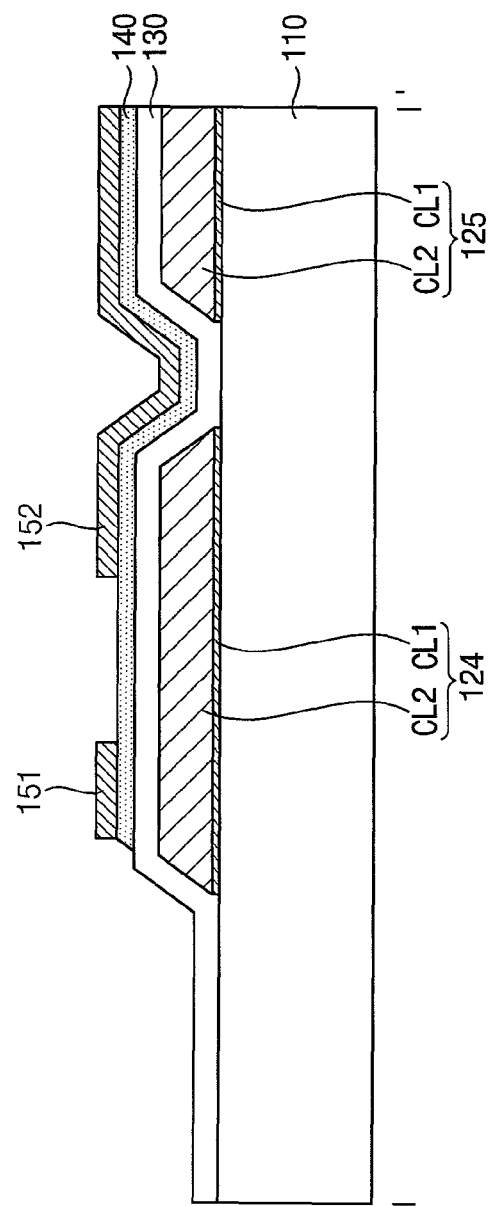
FIGS. 7A to 7G are cross-sectional views illustrating a method of manufacturing the display substrate of FIGS. 5 and 6.
Figure 7B:
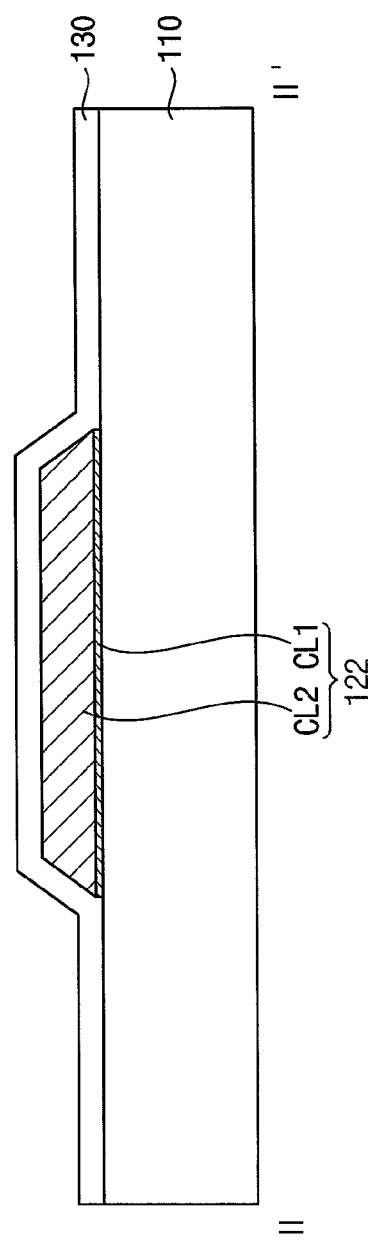

Referring to FIGS. 7A and 7B, the gate electrode 124 and the storage line 125 are formed on the base substrate 110. Each of the gate electrode 124 and the storage line 125 may include the first conductive layer CL1 and the second conductive layer CL2.

In addition, the gate insulating layer 130, the semiconductor layer 140, the source electrode 151, and the drain electrode 152 are formed.

The gate insulating layer 130 is disposed on the gate line 122, the gate electrode 124, and the storage line 125.

The semiconductor layer 140 is disposed on the gate insulating layer 130. At least some of the semiconductor layer 140 overlaps the gate electrode 124. In addition, at least some of the semiconductor layer 140 overlaps the source electrode 151 and the drain electrode 152.

The source electrode 151 and the drain electrode 152 are disposed on the semiconductor layer 140. The source electrode 151 overlaps one portion of the semiconductor layer 140. The drain electrode 152 overlaps another portion of the semiconductor layer 140. The source electrode 151 is spaced apart from the drain electrode 152.

Figure 7C:
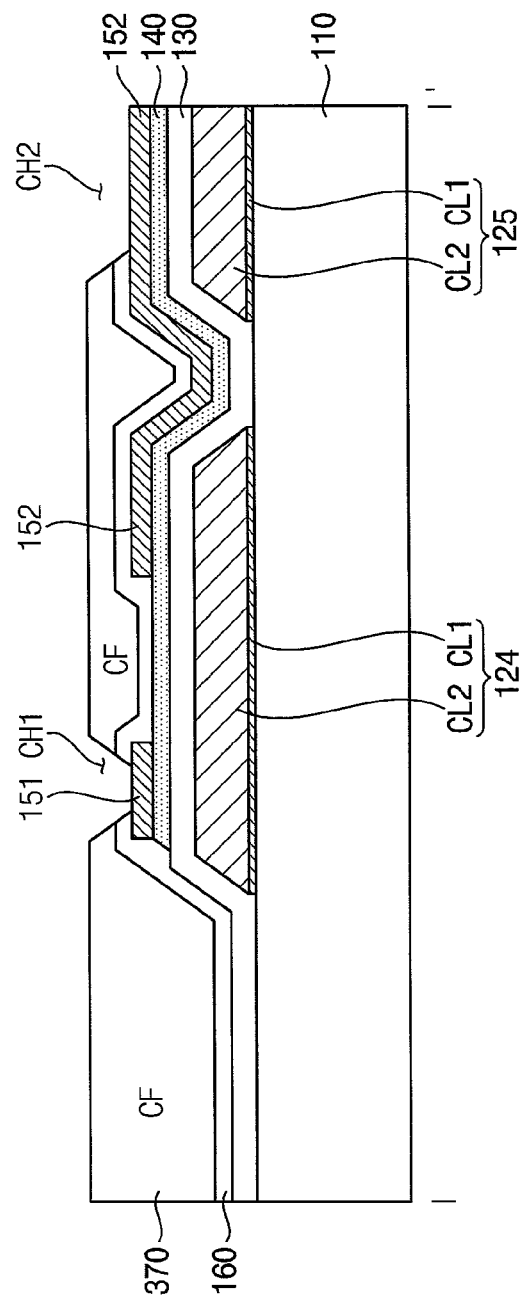
Figure 7D:
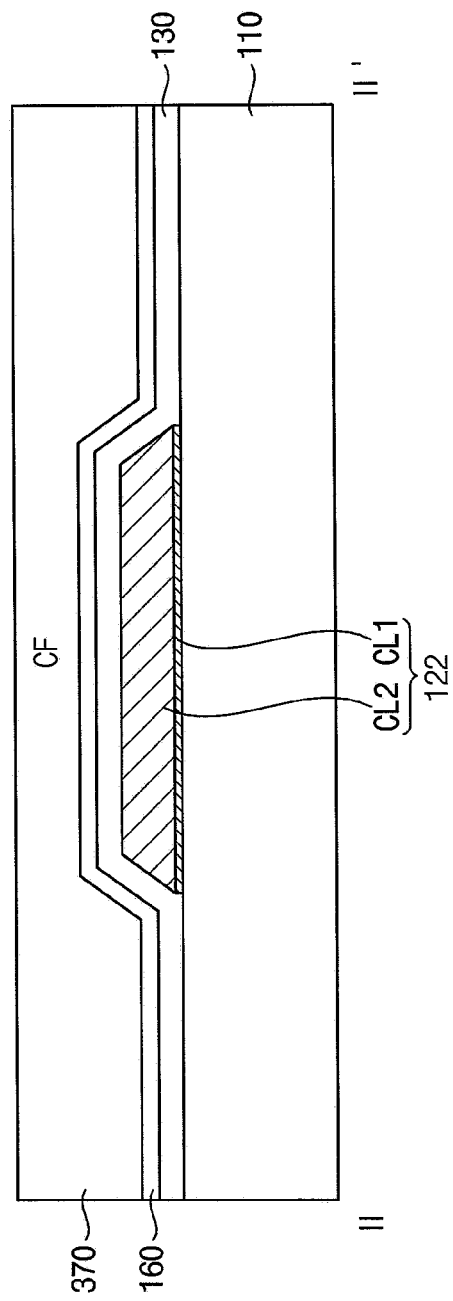

Referring to FIGS. 7C and 7D, the first passivation layer 160 and the color filter layer 370 are formed.

Specifically, a first passivation material layer forming the first passivation layer 160 is disposed on the source electrode 151 and the drain electrode 152, and a color filter material layer forming the color filter layer 370 is disposed on the first passivation material layer. The first passivation layer 160 and the color filter layer 370 may be formed by exposing the first passivation material layer and the color filter material layer using a mask having a pattern corresponding to the first contact hole CH1 and the second contact hole CH2 in the first passivation material layer and the color filter material layer.

The color filter layer 370 may include an organic insulating material. Specifically, the color filter layer 370 may include a color filter (CF) material. The color filter layer 370 may include at least one of a red color filter layer, a green color filter layer, a blue color filter layer, and a white color filter layer. An upper surface of the color filter layer 370 is substantially flat. Thus, the color filter layer 370 may decrease and planarize a local step difference generated by elements disposed between the base substrate 110 and the color filter layer 370. The color filter layer 370 may be disposed in the whole area of the pixel PX including the active area ACA.

Figure 7E:
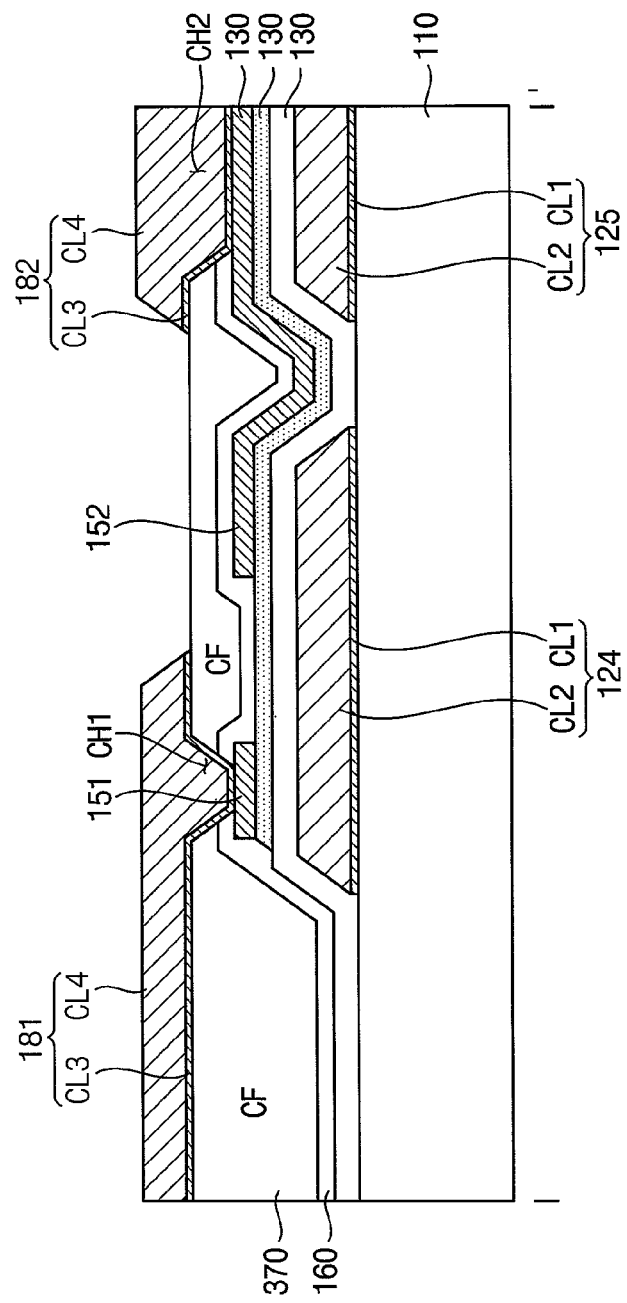
Figure 7F:
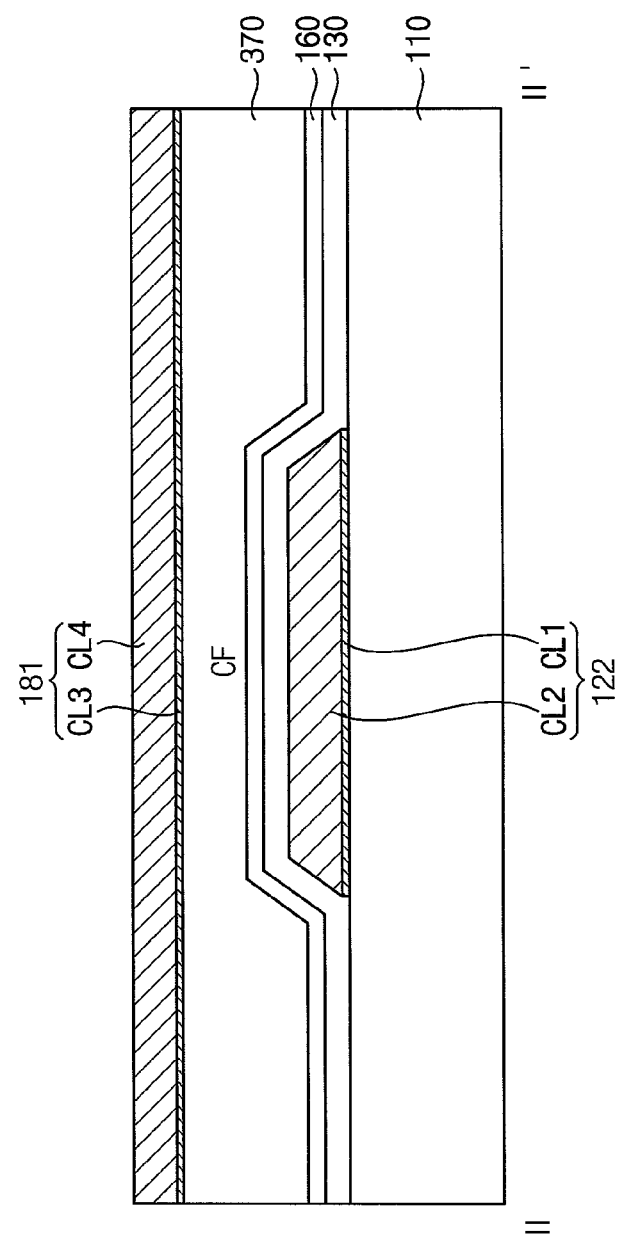

Referring to FIGS. 7E and 7F, the data line 181 and the connection electrode 182 are formed.

The data line 181 extends substantially in the second direction D2 substantially perpendicular to the first direction D1. The data line 181 receives the data signal from a data driving part and transfers the data signal to the source electrode 151. The data line 181 is electrically connected to the source electrode 151 through the first contact hole CH1 formed through the color filter layer 370. The data line 181 includes a material different from that of the source electrode 151. In addition, the data line 181 has the third thickness dt3. In one embodiment, the third thickness dt3 of the data line 181 is greater than the second thickness dt2 of each of the source electrode 151 and the drain electrode 152. For example, the second thickness dt2 of each of the source electrode 151 and the drain electrode 152 may be less than a half of the third thickness dt3 of the data line 181. Since the third thickness dt3 of the data line 181 is greater than the second thickness dt2 of each of the source electrode 151 and the drain electrode 152, a resistance of the data line 181 is comparatively low. Thus, a charge rate of a pixel voltage that is generated by a charge of the data signal transferred through the data line 181 to the pixel PX may be improved.

The connection electrode 182 is disposed on the color filter layer 370. In addition, the connection electrode 182 is disposed between the pixel electrode 220 and the drain electrode 152. The connection electrode 182 may be electrically connected to the drain electrode 152 through the second contact hole CH2 formed through the color filter layer 370. The connection electrode 182 receives the data signal from the drain electrode 152 and transfers the data signal to the pixel electrode 220.

The data line 181 and the connection electrode 182 may include the same material. Each of the data line 181 and the connection electrode 182 may have a single layer structure or a multi layer structure having a plurality of metal layers including materials different from each other. For example, each of the data line 181 and the connection electrode 182 may include the third conductive layer CL3 and the fourth conductive layer CL4.

The third conductive layer CL3 may fix the fourth conductive layer CL4 to the color filter layer 370, the source electrode 151 and the drain electrode 152 so that the fourth conductive layer CL4 is not separated from the color filter layer 370, the source electrode 151 and the drain electrode 152. In addition, the third conductive layer CL3 may transfer the data signal. The third conductive layer CL3 may include at least one of Indium Zinc Oxide (IZO), Indium Tin Oxide (ITO), Gallium Zinc Oxide (GZO) and Zinc Aluminum Oxide (ZAO). However, the third conductive layer CL3 is not limited thereto, and the third conductive layer CL3 may include titanium (Ti).

The fourth conductive layer CL4 is disposed on the third conductive layer CL3. The fourth conductive layer CL4 may transfer the data signal. A cross-sectional thickness of the fourth conductive layer CL4 may be greater than that of the third conductive layer CL3. The fourth conductive layer CL4 may include an aluminum group metal including aluminum (Al) and aluminum alloy, a silver group metal including silver (Ag) and silver alloy, a copper group metal including copper (Cu) and copper alloy, a molybdenum group metal including molybdenum (Mo) and molybdenum alloy, chrome (Cr), tantalum (Ta), and titanium (Ti).

Figure 7G:
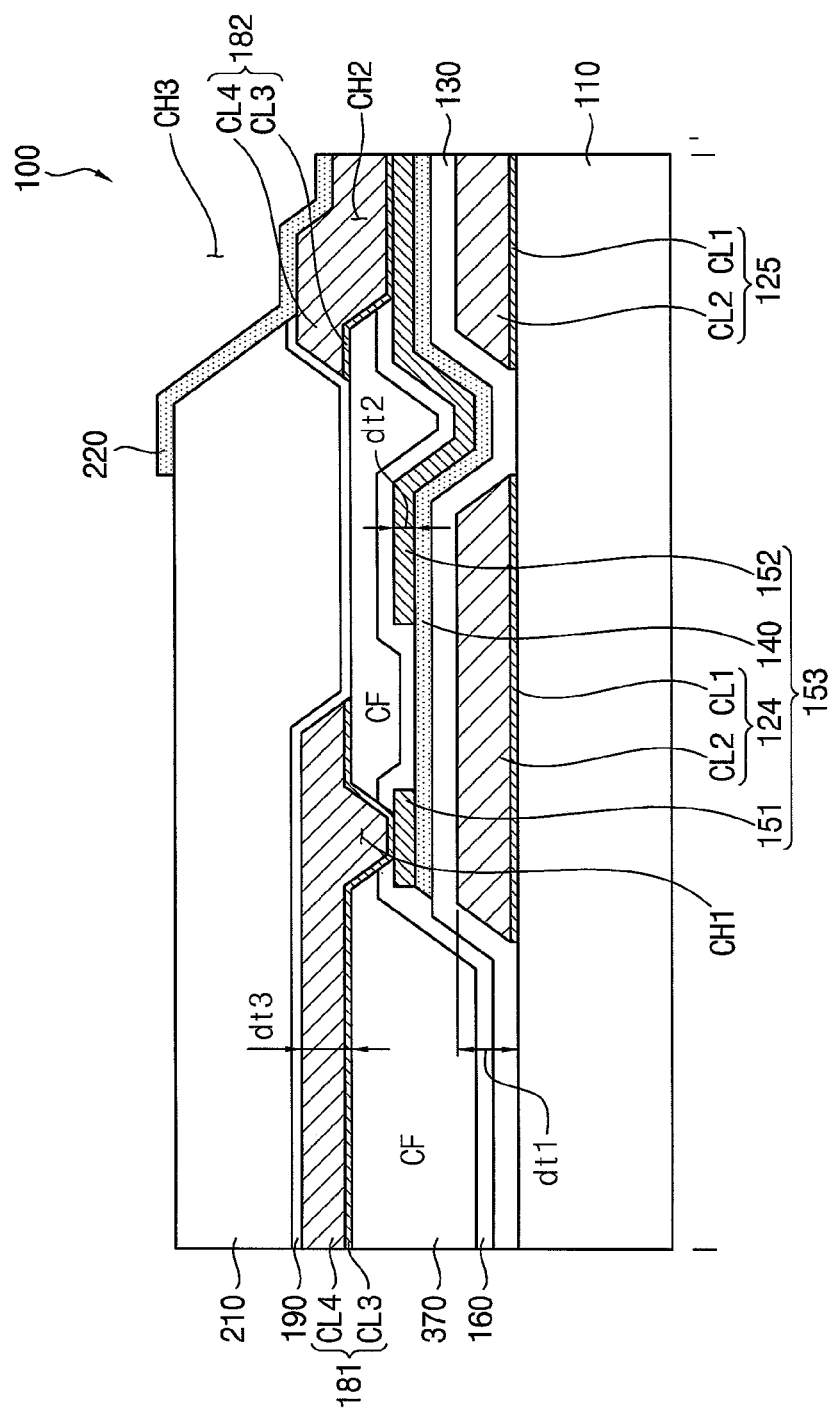

Referring to FIG. 7G, the second passivation layer 190, the insulating layer 210, and the pixel electrode 220 are formed on the data line 181 and the connection electrode 182. Thus, the display substrate 300 is formed.

According to the present exemplary embodiment, the RC delay of the data signal that is transferred through the data line 181 and the connection electrode 182 decreases. Thus, a charge rate of a pixel voltage that is generated by a charge of the data signal to the pixel PX may be improved. Thus, a display apparatus including the display substrate 300 may be improved.

Figure 8:
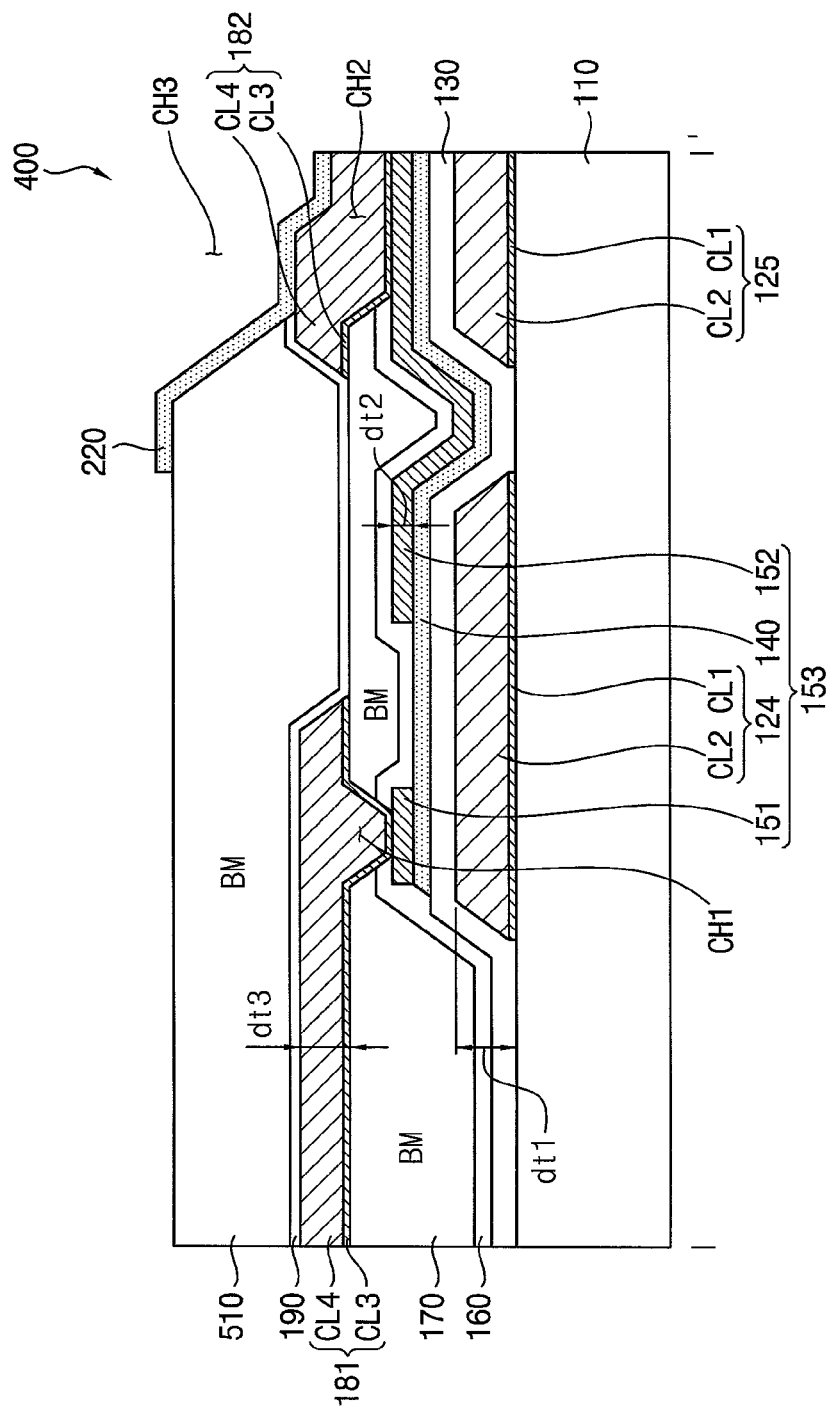
FIG. 8 is a cross-sectional view taken along a line I-I' of FIG. 1 according to an exemplary embodiment of the present inventive concept.

FIG. 8 is a cross-sectional view taken along a line I-I' of FIG. 1 according to an exemplary embodiment of the present inventive concept.

The display substrate 400 according to the present exemplary embodiment illustrated in FIG. 8 is substantially the same as the display substrate 100 according to the previous exemplary embodiment illustrated in FIGS. 1 to 3 except for a second black organic layer 510. Thus, the same reference numerals may be used to refer to same or like elements as those described in the previous exemplary embodiment and any further repetitive explanation concerning the above elements may be omitted.

Referring to FIGS. 1 and 8, the display substrate 400 includes the base substrate 110, the gate line 122, the data line 181, the storage line 125, the thin film transistor 153, the gate insulating layer 130, the first passivation layer 160, the first black organic layer 170, the connection electrode 182, the second passivation layer 190, the second black organic layer 510, and the pixel electrode 220.

The first black organic layer 170 is substantially the same as the black organic layer 170 according to the previous exemplary embodiment illustrated in FIGS. 2 and 3. Thus, the first black organic layer 170 may include an organic insulating material. Specifically, the first black organic layer 170 may include a black matrix (BM) material. An upper surface of the first black organic layer 170 is substantially flat. Thus, the first black organic layer 170 may decrease and planarize a local step difference generated by elements disposed between the base substrate 110 and the first black organic layer 170. The first black organic layer 170 may be disposed in an area of the pixel PX except for the active area ACA.

The second black organic layer 510 is disposed on the second passivation layer 190. The second black organic layer 510 may include an organic material. Specifically, the second black organic layer 510 may include a black matrix (BM) material. An upper surface of the second black organic layer 510 is substantially flat. Thus, the second black organic layer 510 may decrease and planarize a local step difference generated by elements disposed between the base substrate 110 and the second black organic layer 510.

The pixel electrode 220 is disposed on the second black organic layer 510.

A method of manufacturing the display substrate 400 of FIG. 8 is substantially the same as the method of manufacturing the display substrate 100 of FIGS. 2 and 3 except for forming the second black organic layer 510 instead of forming the insulating layer 210 of FIG. 2.

Specifically, the gate electrode 124 and the storage line 125 are formed on the base substrate 110.

The gate insulating layer 130, the semiconductor layer 140, the source electrode 151, and the drain electrode 152 are formed.

The first passivation layer 160 and the black organic layer 170 are formed.

The data line 181 and the connection electrode 182 are formed.

The second passivation layer 190, the second black organic layer 510, and the pixel electrode 220 are formed on the data line 181 and the connection electrode 182. Thus, the display substrate 400 is formed.

According to the present exemplary embodiment, an RC delay of the data signal that is transferred through the data line 181 and the connection electrode 182 decreases. Thus, a charge rate of a pixel voltage that is generated by a charge of the data signal to the pixel PX may be improved.

In addition, the first black organic layer 170 and the second black organic layer 510 capable of functioning as a black matrix are disposed in the display substrate 400. In one embodiment, the display substrate 100 including the black matrix may be combined with a facing substrate including another black matrix. In this case, a light leakage that can occur due to a misalignment between the facing substrate and the display substrate 400 may be prevented.

In addition, since the display substrate 400 includes the first black organic layer 170 and the second black organic layer 510, when the display substrate 400 is included in a flip display panel that displays an image to a rear side of the flip display panel, a reflectivity of the flip display panel may decrease.

Thus, display quality of a display apparatus including the display substrate 400 may be improved.

Figure 9:
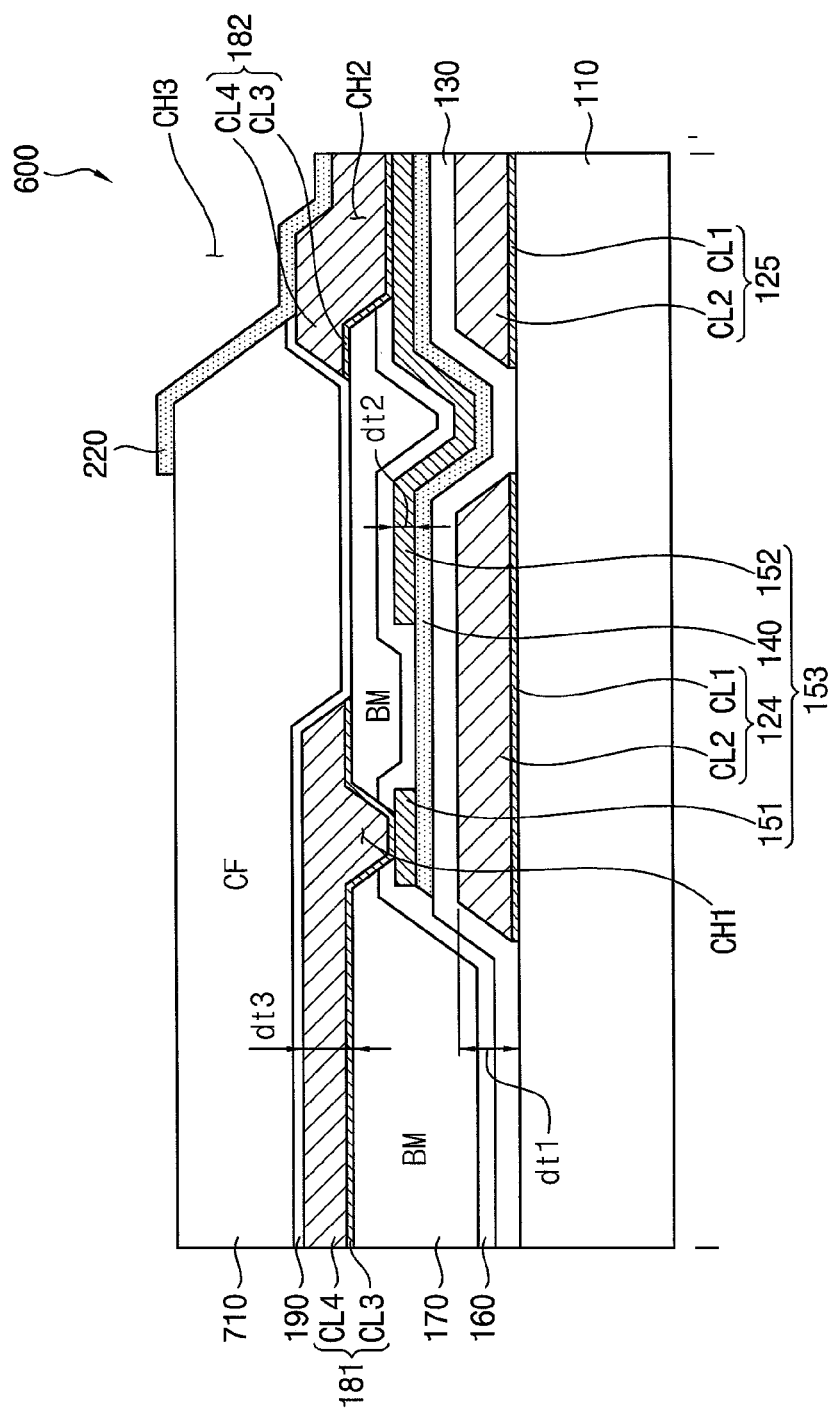
FIG. 9 is a cross-sectional view taken along a line I-I' of FIG. 1 according to an exemplary embodiment of the present inventive concept.

FIG. 9 is a cross-sectional view taken along a line I-I' of FIG. 1 according to an exemplary embodiment of the present inventive concept.

The display substrate 600 according to the present exemplary embodiment illustrated in FIG. 9 is substantially the same as the display substrate 100 according to the previous exemplary embodiment illustrated in FIGS. 1 to 3 except for a color filter layer 710. Thus, the same reference numerals may be used to refer to same or like elements as those described in the previous exemplary embodiment and any further repetitive explanation concerning the above elements may be omitted.

Referring to FIGS. 1 and 9, the display substrate 600 includes the base substrate 110, the gate line 122, the data line 181, the storage line 125, the thin film transistor 153, the gate insulating layer 130, the first passivation layer 160, the black organic layer 170, the connection electrode 182, the second passivation layer 190, the color filter layer 710 and the pixel electrode 220.

The color filter layer 710 is disposed on the second passivation layer 190. The color filter layer 710 may include an organic material. Specifically, the color filter layer 710 may include a color filter material. The color filter layer 710 may include at least one of a red color filter layer, a green color filter layer, a blue color filer layer, and a white color filer layer. An upper surface of the color filter layer 710 is substantially flat. Thus, the color filter layer 710 may decrease and planarize a local step difference generated by elements disposed between the base substrate 110 and the color filter layer 710.

The pixel electrode 220 is disposed on the color filter layer 710.

A method of manufacturing the display substrate 600 of FIG. 9 is substantially the same as the method of manufacturing the display substrate 100 of FIGS. 2 and 3 except for forming the color filter layer 710 instead of forming the insulating layer 210 of FIG. 2.

Specifically, the gate electrode 124 and the storage line 125 are formed on the base substrate 110.

The gate insulating layer 130, the semiconductor layer 140, the source electrode 151, and the drain electrode 152 are formed.

The first passivation layer 160 and the black organic layer 170 are formed.

The data line 181 and the connection electrode 182 are formed.

The second passivation layer 190, the color filer layer 710, and the pixel electrode 220 are formed on the data line 181 and the connection electrode 182. Thus, the display substrate 600 is formed.

According to the present exemplary embodiment, an RC delay of the data signal that is transferred through the data line 181 and the connection electrode 182 decreases. Thus, a charge rate of a pixel voltage that is generated by a charge of the data signal to the pixel PX may be improved.

In addition, the first black organic layer 170 capable of functioning as a black matrix is disposed in the display substrate 600. In one embodiment, the display substrate 100 including the black matrix may be combined with a facing substrate including another black matrix. In this case, a light leakage that can occur due to a misalignment between the facing substrate and the display substrate 600 may be prevented.

In addition, since the display substrate 600 includes the black organic layer 170, when the display substrate 600 is included in a flip display panel that displays an image to a rear side of the flip display panel, a reflectivity of the flip display panel may decrease.

In addition, since the display substrate 600 includes the black organic layer 170 and the color filter layer 710, a contrast ratio of the display substrate may be improved.

Thus, display quality of a display apparatus including the display substrate 600 may be improved.

Figure 10:
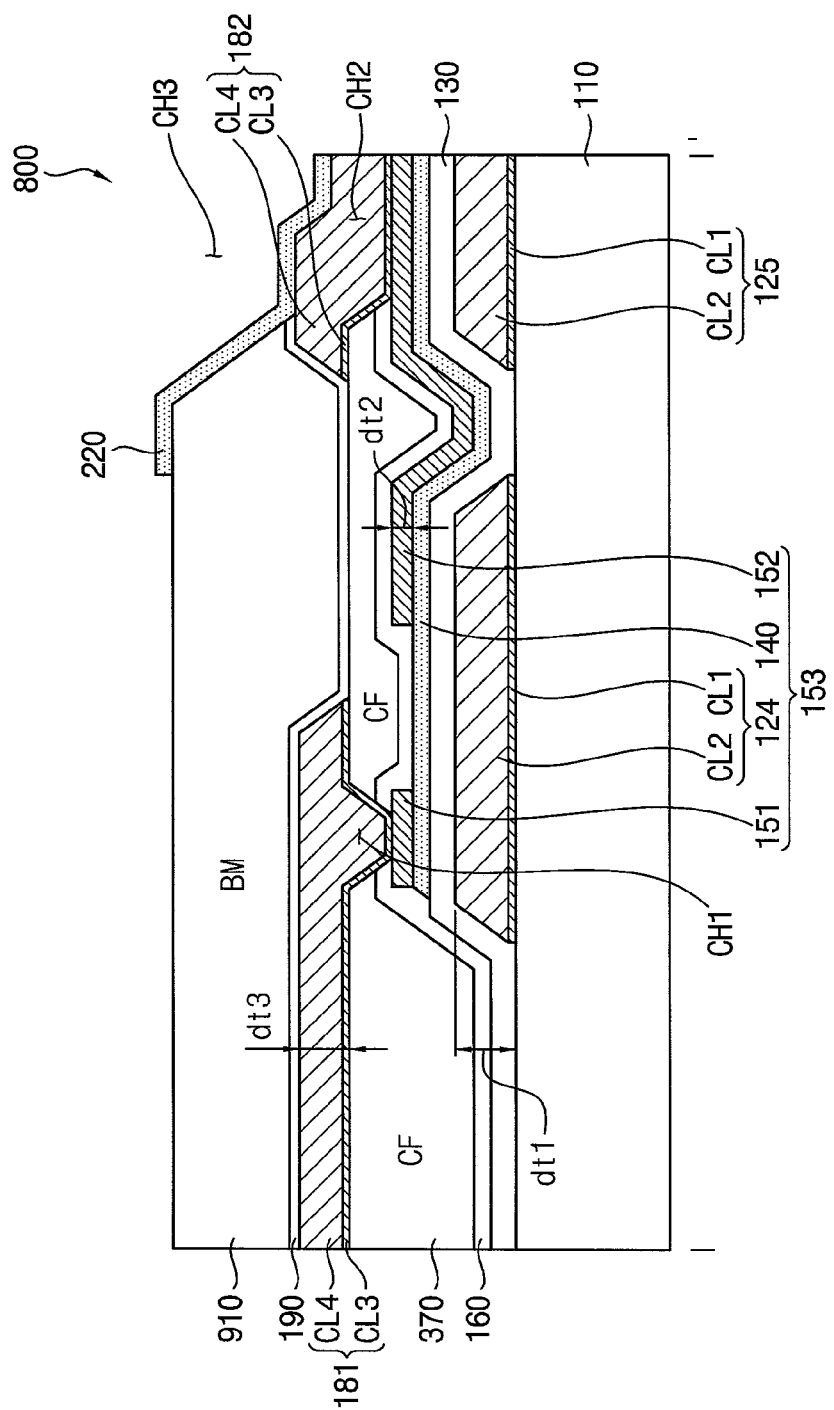
FIG. 10 is a cross-sectional view taken along a line I-I' of FIG. 1 according to an exemplary embodiment of the present inventive concept.

FIG. 10 is a cross-sectional view taken along a line I-I' of FIG. 1 according to an exemplary embodiment of the present inventive concept.

The display substrate 800 according to the present exemplary embodiment illustrated in FIG. 10 is substantially the same as the display substrate 100 according to the previous exemplary embodiment illustrated in FIGS. 1 to 3 except for a color filter layer 370 and a black organic layer 910. In addition, the display substrate 800 according to the present exemplary embodiment illustrated in FIG. 10 is substantially the same as the display substrate 300 according to the previous exemplary embodiment illustrated in FIGS. 5 and 6 except for the black organic layer 910. Thus, the same reference numerals may be used to refer to same or like elements as those described in the previous exemplary embodiment and any further repetitive explanation concerning the above elements may be omitted.

Referring to FIGS. 1 and 10, the display substrate 800 includes the base substrate 110, the gate line 122, the data line 181, the storage line 125, the thin film transistor 153, the gate insulating layer 130, the first passivation layer 160, the color filter layer 370, the connection electrode 182, the second passivation layer 190, the black organic layer 910, and the pixel electrode 220.

The black organic layer 910 is disposed on the second passivation layer 190. The black organic layer 910 may include an organic material. Specifically, the black organic layer 910 may include a black matrix material. An upper surface of the black organic layer 910 is substantially flat. Thus, the black organic layer 910 may decrease and planarize a local step difference generated by elements disposed between the base substrate 110 and the black organic layer 910.

The pixel electrode 220 is disposed on the black organic layer 910.

A method of manufacturing the display substrate 800 of FIG. 10 is substantially the same as the method of manufacturing the display substrate 300 of FIG. 5 except for forming the black organic layer 910 instead of forming the insulating layer 210 of FIG. 5.

Specifically, the gate electrode 124 and the storage line 125 are formed on the base substrate 110.

The gate insulating layer 130, the semiconductor layer 140, the source electrode 151, and the drain electrode 152 are formed.

The first passivation layer 160 and the color filer layer 370 are formed.

The data line 181 and the connection electrode 182 are formed.

The second passivation layer 190, the black organic layer 910, and the pixel electrode 220 are formed on the data line 181 and the connection electrode 182. Thus, the display substrate 800 is formed.

According to the present exemplary embodiment, an RC delay of the data signal that is transferred through the data line 181 and the connection electrode 182 decreases. Thus, a charge rate of a pixel voltage that is generated by a charge of the data signal to the pixel PX may be improved. Thus, display quality of a display apparatus including the display substrate 800 may be improved.

The present display substrate may be applied to an electronic device having a display apparatus. For example, the present display substrate may be applied to a television, a computer monitor, a laptop, a digital camera, a cellular phone, a smart phone, a tablet Personal Computer (PC), a smart pad, a Personal Digital Assistant (PDA), a Portable Multimedia Player (PMP), an MP3 player, a navigation system, a camcorder, a portable game console, etc.

The foregoing is illustrative of the present inventive concept and is not to be construed as limiting thereof. Although exemplary embodiments of the present inventive concept have been described, those skilled in the art will readily appreciate that many modifications are possible in the exemplary embodiments without materially departing from the novel teachings and advantages of the present inventive concept. Accordingly, such modifications are intended to be included within the scope of the present inventive concept. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the present inventive concept. The present inventive concept is defined by the following claims, with equivalents of the claims to be included therein.

What is claimed is:

1. A display substrate comprising:
a base substrate;
a gate electrode disposed on the base substrate;
a semiconductor layer disposed on the gate electrode;
a source electrode disposed on the semiconductor layer;
a drain electrode disposed on the semiconductor layer and spaced apart from the source electrode;
a first black organic layer disposed on the source electrode and the drain electrode;
a data line disposed on the first black organic layer, and electrically connected to the source electrode through a contact hole formed through the first black organic layer; and
a pixel electrode electrically connected to the drain electrode.

2. The display substrate of claim 1, wherein an upper surface of the first black organic layer is substantially flat.

3. The display substrate of claim 1, wherein the data line includes a material different from a material of the source electrode.

4. The display substrate of claim 1, wherein a cross-sectional thickness of the data line is greater than a cross-sectional thickness of the source electrode.

5. The display substrate of claim 1, wherein a cross-sectional thickness of the data line is greater than a cross-sectional thickness of the drain electrode.

6. The display substrate of claim 1, wherein a cross-sectional thickness of the gate electrode is greater than a cross-sectional thickness of the source electrode.

7. The display substrate of claim 1, wherein a cross-sectional thickness of the gate electrode is greater than a cross-sectional thickness of the drain electrode.

8. The display substrate apparatus of claim 1, further comprising:
an insulating layer disposed on the data line.

9. The display substrate of claim 8, wherein the pixel electrode is disposed on the insulating layer.

10. The display substrate of claim 9, further comprising:
a connection electrode disposed on the first black organic layer, and electrically connecting the pixel electrode to the drain electrode.

11. The display substrate of claim 10, wherein a cross-sectional thickness of the connection electrode is greater than a cross-sectional thickness of the source electrode.

12. The display substrate of claim 10, wherein a cross-sectional thickness of the connection electrode is greater than a cross-sectional thickness of the drain electrode.

13. The display substrate of claim 1, further comprising:
a second black organic layer disposed on the data line.

14. The display substrate of claim 13, wherein the pixel electrode is disposed on the second black organic layer.

15. The display substrate of claim 1, further comprising:
a color filter layer disposed on the data line.

16. The display substrate of claim 15, wherein the pixel electrode is disposed on the color filter layer.

17. A display substrate comprising:
a base substrate;
a gate electrode disposed on the base substrate;
a semiconductor layer disposed on the gate electrode;
a source electrode disposed on the semiconductor layer;
a drain electrode disposed on the semiconductor layer and spaced apart from the source electrode;
a color filter layer disposed on the source electrode and the drain electrode;
a data line disposed on the color filter layer and electrically connected to the source electrode through a contact hole formed through the color filter layer;
a pixel electrode electrically connected to the drain electrode; and a connection electrode disposed on the color filter layer and electrically connecting the pixel electrode to the drain electrode.

18. The display substrate of claim 17, wherein an upper surface of the color filter layer is substantially flat.

19. A display substrate comprising:
a base substrate;
a gate electrode disposed on the base substrate;
a semiconductor layer disposed on the gate electrode;
a source electrode disposed on the semiconductor layer;
a drain electrode disposed on the semiconductor layer and spaced apart from the source electrode;
a color filter layer disposed on the source electrode and the drain electrode;
a data line disposed on the color filter layer and electrically connected to the source electrode through a contact hole formed through the color filter layer;
a pixel electrode electrically connected to the drain electrode; and
a black organic layer disposed on the data line.

* * * * *